(12) United States Patent
Lee et al.

(10) Patent No.: US 7,902,660 B1
(45) Date of Patent: Mar. 8, 2011

(54) SUBSTRATE FOR SEMICONDUCTOR DEVICE AND MANUFACTURING METHOD THEREOF

(75) Inventors: Kyu Won Lee, Seoul (KR); Doo Hyun Park, Gyeonggi-do (KR); Dong Hee Kang, Gyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 241 days.

(21) Appl. No.: 11/440,548

(22) Filed: May 24, 2006

(51) Int. Cl.
*H01L 23/04* (2006.01)

(52) U.S. Cl. .................. 257/698; 257/700; 257/E21.507

(58) Field of Classification Search .................... 257/698
See application file for complete search history.

(56) References Cited

U.S. PATENT DOCUMENTS

| | | | | |
|---|---|---|---|---|
| 2,596,993 A | 5/1952 | Gookin | ............ | 18/36 |
| 3,435,815 A | 4/1969 | Forcier | ............ | 125/16 |
| 3,734,660 A | 5/1973 | Davies et al. | ............ | 425/123 |
| 3,781,596 A * | 12/1973 | Galli et al. | ............ | 361/751 |
| 3,838,984 A | 10/1974 | Crane et al. | ............ | 29/193.5 |
| 4,054,238 A | 10/1977 | Lloyd et al. | ............ | 228/173 R |
| 4,189,342 A | 2/1980 | Kock | ............ | 156/656 |
| 4,258,381 A | 3/1981 | Inaba | ............ | 357/70 |
| 4,289,922 A | 9/1981 | Devlin | ............ | 174/52 FP |
| 4,301,464 A | 11/1981 | Otsuki et al. | ............ | 357/70 |
| 4,332,537 A | 6/1982 | Slepcevic | ............ | 425/121 |
| 4,417,266 A | 11/1983 | Grabbe | ............ | 357/80 |
| 4,451,224 A | 5/1984 | Harding | ............ | 425/548 |
| 4,530,152 A | 7/1985 | Roche et al. | ............ | 29/588 |
| 4,541,003 A | 9/1985 | Otsuka et al. | ............ | 357/74 |
| 4,646,710 A | 3/1987 | Schmid et al. | ............ | 125/16 R |
| 4,707,724 A | 11/1987 | Suzuki et al. | ............ | 357/71 |
| 4,727,633 A | 3/1988 | Herrick | ............ | 228/122 |
| 4,729,061 A | 3/1988 | Brown | | |
| 4,737,839 A | 4/1988 | Burt | ............ | 357/67 |
| 4,756,080 A | 7/1988 | Thorp, Jr. et al. | ............ | 29/827 |
| 4,812,896 A | 3/1989 | Rothgery et al. | ............ | 357/70 |
| 4,862,245 A | 8/1989 | Pashby et al. | ............ | 357/70 |
| 4,862,246 A | 8/1989 | Masuda et al. | ............ | 357/70 |
| 4,907,067 A | 3/1990 | Derryberry | ............ | 357/74 |
| 4,920,074 A | 4/1990 | Shimizu et al. | | |

(Continued)

FOREIGN PATENT DOCUMENTS

DE      197 34 794      7/1998

(Continued)

OTHER PUBLICATIONS

Sheridan et al., U.S. Appl. No. 10/868,244, filed Jun. 15, 2004, entitled "Embedded Leadframe Semiconductior Package".

(Continued)

*Primary Examiner* — Charles D Garber
*Assistant Examiner* — Pape Sene
(74) *Attorney, Agent, or Firm* — Gunnison, McKay & Hodgson, L.L.P.; Serge J. Hodgson

(57) ABSTRACT

A substrate for a semiconductor device and a manufacturing thereof, and a semiconductor device using the same and a manufacturing method thereof are disclosed. For example, in the substrate according to the present invention, a core is eliminated, so that the substrate has a very thin thickness, as well, the length of electrically conductive patterns becomes shorter, whereby the electrical efficiency thereof is improved. Moreover, since a carrier having a stiffness of a predetermined strength is bonded on the substrate, it can prevent a warpage phenomenon during the manufacturing process of the semiconductor device. Furthermore, the carrier is removed from the substrate, whereby a solder ball fusing process or an electrical connecting process of the semiconductor die can be easily performed.

15 Claims, 24 Drawing Sheets

U.S. PATENT DOCUMENTS

| | | | | |
|---|---|---|---|---|
| 4,935,803 A | 6/1990 | Kalfus et al. ................ 357/68 |
| 4,942,454 A | 7/1990 | Mori et al. .................. 357/70 |
| 4,987,475 A | 1/1991 | Schlesinger et al. .......... 357/70 |
| 5,018,003 A | 5/1991 | Yasunaga et al. ............. 357/72 |
| 5,029,386 A | 7/1991 | Chao et al. .................. 29/827 |
| 5,041,902 A | 8/1991 | McShane ..................... 357/79 |
| 5,057,900 A | 10/1991 | Yamazaki ..................... 357/70 |
| 5,059,379 A | 10/1991 | Tsutsumi et al. ........ 264/272.14 |
| 5,065,223 A | 11/1991 | Matsuki et al. ............... 357/68 |
| 5,070,039 A | 12/1991 | Johnson et al. |
| 5,087,961 A | 2/1992 | Long et al. .................. 357/69 |
| 5,091,341 A | 2/1992 | Asada et al. |
| 5,096,852 A | 3/1992 | Hobson |
| 5,118,298 A | 6/1992 | Murphy ....................... 439/68 |
| 5,122,860 A | 6/1992 | Kikuchi et al. .............. 357/72 |
| 5,134,773 A | 8/1992 | LeMaire et al. ............... 29/827 |
| 5,151,039 A | 9/1992 | Murphy ....................... 439/70 |
| 5,157,475 A | 10/1992 | Yamaguchi .................... 357/68 |
| 5,157,480 A | 10/1992 | McShane et al. ............... 357/74 |
| 5,168,368 A | 12/1992 | Gow, 3rd et al. ............. 257/666 |
| 5,172,213 A | 12/1992 | Zimmerman ................ 257/796 |
| 5,172,214 A | 12/1992 | Casto ........................ 257/676 |
| 5,175,060 A | 12/1992 | Enomoto et al. ............. 428/620 |
| 5,200,362 A | 4/1993 | Lin et al. |
| 5,200,809 A | 4/1993 | Kwon ......................... 257/707 |
| 5,214,845 A | 6/1993 | King et al. .................. 29/841 |
| 5,216,278 A | 6/1993 | Lin et al. ................... 257/688 |
| 5,218,231 A | 6/1993 | Kudo ......................... 257/735 |
| 5,221,642 A | 6/1993 | Burns |
| 5,250,841 A | 10/1993 | Sloan et al. ................. 257/666 |
| 5,250,843 A | 10/1993 | Eichelberger |
| 5,252,853 A | 10/1993 | Michii ....................... 257/666 |
| 5,258,094 A | 11/1993 | Furui et al. ................. 156/634 |
| 5,266,834 A | 11/1993 | Nishi et al. ................. 257/706 |
| 5,268,310 A | 12/1993 | Goodrich et al. .............. 437/15 |
| 5,273,938 A | 12/1993 | Lin et al. |
| 5,277,972 A | 1/1994 | Sakumoto et al. ............. 428/355 |
| 5,278,446 A | 1/1994 | Nagaraj et al. ............... 257/707 |
| 5,279,029 A | 1/1994 | Burns ........................ 29/856 |
| 5,281,849 A | 1/1994 | Singh Deo et al. ............ 257/666 |
| 5,294,897 A | 3/1994 | Notani et al. ................ 333/33 |
| 5,327,008 A | 7/1994 | Djennas et al. ............... 257/666 |
| 5,332,864 A | 7/1994 | Liang et al. ................. 174/52.4 |
| 5,335,771 A | 8/1994 | Murphy ....................... 206/328 |
| 5,336,931 A | 8/1994 | Juskey et al. ................ 257/787 |
| 5,343,076 A | 8/1994 | Katayama et al. .............. 257/717 |
| 5,353,498 A | 10/1994 | Fillion et al. ................ 29/840 |
| 5,358,905 A | 10/1994 | Chiu |
| 5,365,106 A | 11/1994 | Watanabe ..................... 257/669 |
| 5,381,042 A | 1/1995 | Lerner et al. ................ 257/712 |
| 5,391,439 A | 2/1995 | Tomita et al. ................ 428/571 |
| 5,394,303 A | 2/1995 | Yamaji ....................... 361/749 |
| 5,406,124 A | 4/1995 | Morita et al. ................ 257/783 |
| 5,410,180 A | 4/1995 | Fujii et al. ................. 257/666 |
| 5,414,299 A | 5/1995 | Wang et al. .................. 257/702 |
| 5,417,905 A | 5/1995 | Lemaire et al. ............... 264/139 |
| 5,424,576 A | 6/1995 | Djennas et al. ............... 257/666 |
| 5,428,248 A | 6/1995 | Cha .......................... 257/676 |
| 5,432,677 A | 7/1995 | Mowatt et al. |
| 5,435,057 A | 7/1995 | Bindra et al. ................ 29/830 |
| 5,444,301 A | 8/1995 | Song et al. .................. 257/737 |
| 5,452,511 A | 9/1995 | Chang ........................ 29/827 |
| 5,454,904 A * | 10/1995 | Ghezzo et al. ................ 216/13 |
| 5,454,905 A | 10/1995 | Fogelson ..................... 156/651.1 |
| 5,474,958 A | 12/1995 | Djennas et al. |
| 5,484,274 A | 1/1996 | Neu .......................... 425/116 |
| 5,493,151 A | 2/1996 | Asada et al. ................. 257/686 |
| 5,497,033 A | 3/1996 | Fillion et al. |
| 5,508,556 A | 4/1996 | Lin .......................... 257/691 |
| 5,517,056 A | 5/1996 | Bigler et al. ................ 257/666 |
| 5,521,429 A | 5/1996 | Aono et al. .................. 257/676 |
| 5,528,076 A | 6/1996 | Pavio ........................ 257/666 |
| 5,534,467 A | 7/1996 | Rostoker |
| 5,539,251 A | 7/1996 | Iverson et al. ............... 257/670 |
| 5,543,657 A | 8/1996 | Diffenderfer et al. .......... 257/666 |
| 5,544,412 A | 8/1996 | Romero et al. ................ 29/832 |
| 5,545,923 A | 8/1996 | Barber ....................... 257/691 |
| 5,576,517 A | 11/1996 | Wojnarowski et al. ......... 174/262 |
| 5,578,525 A | 11/1996 | Mizukoshi |
| 5,581,122 A | 12/1996 | Chao et al. .................. 257/691 |
| 5,592,019 A | 1/1997 | Ueda et al. .................. 257/666 |
| 5,592,025 A | 1/1997 | Clark et al. ................. 257/774 |
| 5,594,274 A | 1/1997 | Suetaki ...................... 257/667 |
| 5,595,934 A | 1/1997 | Kim |
| 5,604,376 A | 2/1997 | Hamburgen et al. ............ 257/676 |
| 5,608,265 A | 3/1997 | Kitano et al. ................ 257/738 |
| 5,608,267 A | 3/1997 | Mahulikar et al. ............ 257/796 |
| 5,619,068 A | 4/1997 | Benzoni ...................... 257/690 |
| 5,625,222 A | 4/1997 | Yoneda et al. ................ 257/687 |
| 5,633,528 A | 5/1997 | Abbott et al. ................ 257/666 |
| 5,639,990 A | 6/1997 | Nishihara et al. ............. 174/52.2 |
| 5,640,047 A | 6/1997 | Nakashima ................. 257/738 |
| 5,641,997 A | 6/1997 | Ohta et al. .................. 257/788 |
| 5,643,433 A | 7/1997 | Fukase et al. ................ 205/78 |
| 5,644,169 A | 7/1997 | Chun ......................... 257/787 |
| 5,646,831 A | 7/1997 | Manteghi .................... 361/813 |
| 5,650,663 A | 7/1997 | Parthasarathi ................ 257/706 |
| 5,661,088 A | 8/1997 | Tessier et al. ............... 29/841 |
| 5,665,996 A | 9/1997 | Williams et al. .............. 257/401 |
| 5,673,479 A | 10/1997 | Hawthorne ................... 29/832 |
| 5,683,806 A | 11/1997 | Sakumoto et al. .............. 428/343 |
| 5,689,135 A | 11/1997 | Ball ......................... 257/676 |
| 5,696,666 A | 12/1997 | Miles et al. ................. 361/764 |
| 5,701,034 A | 12/1997 | Marrs ........................ 257/706 |
| 5,703,407 A | 12/1997 | Hori ......................... 257/783 |
| 5,710,064 A | 1/1998 | Song et al. |
| 5,723,899 A | 3/1998 | Shin ......................... 257/666 |
| 5,724,233 A | 3/1998 | Honda et al. ................. 361/813 |
| 5,726,493 A | 3/1998 | Yamashita et al. ............. 257/698 |
| 5,736,432 A | 4/1998 | Mackessy .................... 438/123 |
| 5,736,448 A * | 4/1998 | Saia et al. .................. 438/393 |
| 5,745,984 A | 5/1998 | Cole, Jr. et al. ............. 29/834 |
| 5,753,532 A | 5/1998 | Sim |
| 5,753,977 A | 5/1998 | Kusaka et al. ................ 257/787 |
| 5,766,972 A | 6/1998 | Takahashi et al. ............. 438/127 |
| 5,769,989 A | 6/1998 | Hoffmeyer et al. ............. 156/94 |
| 5,770,888 A | 6/1998 | Song et al. .................. 257/696 |
| 5,776,798 A | 7/1998 | Quan et al. .................. 438/112 |
| 5,783,861 A | 7/1998 | Son .......................... 253/693 |
| 5,786,238 A | 7/1998 | Pai et al. ................... 438/118 |
| 5,801,440 A | 9/1998 | Chu et al. ................... 257/691 |
| 5,814,877 A | 9/1998 | Diffenderfer et al. .......... 257/666 |
| 5,814,881 A | 9/1998 | Alagaratnam et al. ........... 257/686 |
| 5,814,883 A | 9/1998 | Sawai et al. ................. 257/712 |
| 5,814,884 A | 9/1998 | Davis et al. ................. 257/723 |
| 5,817,540 A | 10/1998 | Wark ......................... 438/107 |
| 5,818,105 A | 10/1998 | Kouda ........................ 257/696 |
| 5,821,457 A | 10/1998 | Mosley et al. ................ 174/52.4 |
| 5,821,615 A | 10/1998 | Lee .......................... 257/686 |
| 5,834,830 A | 11/1998 | Cho .......................... 257/667 |
| 5,835,988 A | 11/1998 | Ishii ........................ 257/684 |
| 5,841,193 A | 11/1998 | Eichelberger ................. 257/723 |
| 5,844,306 A | 12/1998 | Fujita et al. ................ 257/676 |
| 5,856,911 A | 1/1999 | Riley ........................ 361/704 |
| 5,859,471 A | 1/1999 | Kuraishi et al. .............. 257/666 |
| 5,859,475 A | 1/1999 | Freyman et al. |
| 5,866,939 A | 2/1999 | Shin et al. .................. 257/666 |
| 5,871,782 A | 2/1999 | Choi ......................... 425/116 |
| 5,874,770 A | 2/1999 | Saia et al. .................. 257/536 |
| 5,874,784 A | 2/1999 | Aoki et al. .................. 257/787 |
| 5,877,043 A | 3/1999 | Alcoe et al. ................. 438/123 |
| 5,886,397 A | 3/1999 | Ewer ......................... 257/667 |
| 5,886,398 A | 3/1999 | Low et al. ................... 257/667 |
| 5,894,108 A | 4/1999 | Mostafazadeh et al. ....... 174/52.4 |
| 5,897,339 A | 4/1999 | Song et al. .................. 438/118 |
| 5,900,676 A | 5/1999 | Kweon et al. ................. 257/787 |
| 5,903,049 A | 5/1999 | Mori ......................... 257/686 |
| 5,903,050 A | 5/1999 | Thurairajaratnam et al. 257/695 |
| 5,909,053 A | 6/1999 | Fukase et al. ................ 257/666 |
| 5,915,998 A | 6/1999 | Stidham et al. ............... 439/723 |
| 5,917,242 A | 6/1999 | Ball ......................... 257/737 |
| 5,937,324 A | 8/1999 | Abercrombie et al. ........... 438/648 |
| 5,939,779 A | 8/1999 | Kim .......................... 257/692 |
| 5,942,794 A | 8/1999 | Okumura et al. ............... 257/666 |
| 5,951,305 A | 9/1999 | Haba ......................... 439/70 |
| 5,959,356 A | 9/1999 | Oh ........................... 257/738 |
| 5,969,426 A | 10/1999 | Baba et al. .................. 257/778 |

| Patent No. | Kind | Date | Inventor(s) | Class |
|---|---|---|---|---|
| 5,973,388 | A | 10/1999 | Chew et al. | 257/676 |
| 5,976,912 | A | 11/1999 | Fukutomi et al. | 438/110 |
| 5,977,613 | A | 11/1999 | Takata et al. | 257/666 |
| 5,977,615 | A | 11/1999 | Yamaguchi et al. | 257/666 |
| 5,977,630 | A | 11/1999 | Woodworth et al. | 257/712 |
| 5,981,314 | A | 11/1999 | Glenn et al. | 438/127 |
| 5,982,632 | A | 11/1999 | Mosley et al. | 361/775 |
| 5,986,333 | A | 11/1999 | Nakamura | 257/667 |
| 5,986,885 | A | 11/1999 | Wyland | 361/704 |
| 6,001,671 | A | 12/1999 | Fjelstad | 438/112 |
| 6,013,947 | A | 1/2000 | Lim | 257/685 |
| 6,018,189 | A | 1/2000 | Mizuno | 257/668 |
| 6,020,625 | A | 2/2000 | Qin et al. | 257/666 |
| 6,025,640 | A | 2/2000 | Yagi et al. | 257/666 |
| 6,031,279 | A | 2/2000 | Lenz | 257/686 |
| RE36,613 | E | 3/2000 | Ball | 257/777 |
| 6,034,423 | A | 3/2000 | Mostafazadeh et al. | 257/691 |
| 6,040,626 | A | 3/2000 | Cheah et al. | 257/735 |
| 6,043,430 | A | 3/2000 | Chun | 174/52.4 |
| 6,060,768 | A | 5/2000 | Hayashida et al. | 257/666 |
| 6,060,769 | A | 5/2000 | Wark | 257/666 |
| 6,072,228 | A | 6/2000 | Hinkle et al. | 257/666 |
| 6,075,284 | A | 6/2000 | Choi et al. | 257/676 |
| 6,081,029 | A | 6/2000 | Yamaguchi | 257/718 |
| 6,084,310 | A | 7/2000 | Mizuno et al. | 257/779 |
| 6,087,715 | A | 7/2000 | Sawada et al. | 257/666 |
| 6,087,722 | A | 7/2000 | Lee et al. | 257/723 |
| 6,097,089 | A * | 8/2000 | Gaku et al. | 257/712 |
| 6,100,594 | A | 8/2000 | Fukui et al. | 257/777 |
| 6,113,474 | A | 9/2000 | Shih et al. | 451/72 |
| 6,114,752 | A | 9/2000 | Huang et al. | 257/666 |
| 6,118,174 | A | 9/2000 | Kim | 257/676 |
| 6,118,184 | A | 9/2000 | Ishio et al. | 257/787 |
| RE36,907 | E | 10/2000 | Templeton, Jr. et al. | 257/666 |
| 6,130,115 | A | 10/2000 | Okumura et al. | 438/124 |
| 6,130,473 | A | 10/2000 | Mostafazadeh et al. | 257/666 |
| 6,133,623 | A | 10/2000 | Otsuki et al. | 257/666 |
| 6,140,154 | A | 10/2000 | Hinkle et al. | 438/123 |
| 6,143,981 | A | 11/2000 | Glenn | 174/52.4 |
| 6,159,767 | A | 12/2000 | Eichelberger | |
| 6,169,329 | B1 | 1/2001 | Farnworth et al. | 257/780 |
| 6,177,718 | B1 | 1/2001 | Kozono | 257/666 |
| 6,181,002 | B1 | 1/2001 | Juso et al. | 257/686 |
| 6,184,465 | B1 | 2/2001 | Corisis | 174/52.4 |
| 6,184,573 | B1 | 2/2001 | Pu | 257/666 |
| 6,194,250 | B1 | 2/2001 | Melton et al. | |
| 6,194,777 | B1 | 2/2001 | Abbott et al. | 257/666 |
| 6,197,615 | B1 | 3/2001 | Song et al. | 438/111 |
| 6,198,171 | B1 | 3/2001 | Huang et al. | 257/787 |
| 6,201,186 | B1 | 3/2001 | Daniels et al. | 174/52.4 |
| 6,201,292 | B1 | 3/2001 | Yagi et al. | 257/666 |
| 6,204,554 | B1 | 3/2001 | Ewer et al. | 257/705 |
| 6,208,020 | B1 | 3/2001 | Minamio et al. | 257/684 |
| 6,208,021 | B1 | 3/2001 | Ohuchi et al. | 257/690 |
| 6,208,023 | B1 | 3/2001 | Nakayama et al. | 257/696 |
| 6,211,462 | B1 | 4/2001 | Carter, Jr. et al. | 174/52.4 |
| 6,214,525 | B1 | 4/2001 | Boyko et al. | |
| 6,217,987 | B1 * | 4/2001 | Ono et al. | 428/209 |
| 6,218,731 | B1 | 4/2001 | Huang et al. | 257/738 |
| 6,222,258 | B1 | 4/2001 | Asano et al. | 257/675 |
| 6,222,259 | B1 | 4/2001 | Park et al. | 257/690 |
| 6,225,146 | B1 | 5/2001 | Yamaguchi et al. | 438/123 |
| 6,229,200 | B1 | 5/2001 | Mclellan et al. | 257/666 |
| 6,229,205 | B1 | 5/2001 | Jeong et al. | 257/676 |
| 6,239,367 | B1 | 5/2001 | Hsuan et al. | 174/52.4 |
| 6,239,384 | B1 | 5/2001 | Smith et al. | 174/261 |
| 6,242,281 | B1 | 6/2001 | Mclellan et al. | 438/106 |
| 6,256,200 | B1 | 7/2001 | Lam et al. | 361/704 |
| 6,258,192 | B1 | 7/2001 | Natarajan | 156/89.15 |
| 6,258,629 | B1 | 7/2001 | Niones et al. | 438/111 |
| 6,261,918 | B1 | 7/2001 | So | 438/401 |
| 6,281,566 | B1 | 8/2001 | Magni | 257/666 |
| 6,281,568 | B1 | 8/2001 | Glenn et al. | 257/684 |
| 6,282,095 | B1 | 8/2001 | Houghton et al. | 361/704 |
| 6,285,075 | B1 | 9/2001 | Combs et al. | 257/675 |
| 6,291,271 | B1 | 9/2001 | Lee et al. | 438/121 |
| 6,291,273 | B1 | 9/2001 | Miyaki et al. | 438/123 |
| 6,294,100 | B1 | 9/2001 | Fan et al. | 216/14 |
| 6,294,830 | B1 | 9/2001 | Fjelstad | 257/724 |
| 6,295,977 | B1 | 10/2001 | Ripper et al. | 125/16.02 |
| 6,297,548 | B1 | 10/2001 | Moden et al. | 257/686 |
| 6,303,984 | B1 | 10/2001 | Corisis | 257/670 |
| 6,303,997 | B1 | 10/2001 | Lee | 257/778 |
| 6,307,272 | B1 | 10/2001 | Takahashi et al. | 257/787 |
| 6,309,909 | B1 | 10/2001 | Ohgiyama | 438/112 |
| 6,316,822 | B1 | 11/2001 | Venkateshwaran et al. | 257/666 |
| 6,316,838 | B1 | 11/2001 | Ozawa et al. | 257/778 |
| 6,323,550 | B1 | 11/2001 | Martin et al. | 257/704 |
| 6,326,243 | B1 | 12/2001 | Suzuya et al. | 438/124 |
| 6,326,244 | B1 | 12/2001 | Brooks et al. | 438/124 |
| 6,326,678 | B1 | 12/2001 | Karnezos et al. | 257/666 |
| 6,335,564 | B1 | 1/2002 | Pour | 257/666 |
| 6,337,510 | B1 | 1/2002 | Chun-Jen et al. | 257/666 |
| 6,339,255 | B1 | 1/2002 | Shin | 257/686 |
| 6,348,726 | B1 | 2/2002 | Bayan et al. | 257/666 |
| 6,355,502 | B1 | 3/2002 | Kang et al. | 438/110 |
| 6,365,974 | B1 | 4/2002 | Abbott et al. | 257/774 |
| 6,369,447 | B2 | 4/2002 | Mori | 257/777 |
| 6,369,454 | B1 | 4/2002 | Chung | 257/787 |
| 6,373,127 | B1 | 4/2002 | Baudouin et al. | 257/676 |
| 6,380,048 | B1 | 4/2002 | Boon et al. | 438/456 |
| 6,384,472 | B1 | 5/2002 | Huang | 257/680 |
| 6,388,336 | B1 | 5/2002 | Venkateshwaran et al. | 257/779 |
| 6,395,578 | B1 | 5/2002 | Shin et al. | 438/106 |
| 6,396,148 | B1 * | 5/2002 | Eichelberger et al. | 257/758 |
| 6,396,153 | B2 | 5/2002 | Fillion et al. | 257/774 |
| 6,400,004 | B1 | 6/2002 | Fan et al. | 257/666 |
| 6,410,979 | B2 | 6/2002 | Abe | 257/684 |
| 6,414,385 | B1 | 7/2002 | Huang et al. | 257/690 |
| 6,418,615 | B1 * | 7/2002 | Rokugawa et al. | 29/852 |
| 6,420,779 | B1 | 7/2002 | Sharma et al. | 257/666 |
| 6,429,508 | B1 | 8/2002 | Gang | 257/678 |
| 6,437,429 | B1 | 8/2002 | Su et al. | 257/666 |
| 6,444,499 | B1 | 9/2002 | Swiss et al. | 438/127 |
| 6,448,633 | B1 | 9/2002 | Yee et al. | 257/666 |
| 6,452,279 | B2 | 9/2002 | Shimoda | 257/777 |
| 6,459,148 | B1 | 10/2002 | Chun-Jen et al. | 257/692 |
| 6,464,121 | B2 | 10/2002 | Reijnders | 225/103 |
| 6,476,469 | B2 | 11/2002 | Hung et al. | 257/676 |
| 6,476,474 | B1 | 11/2002 | Hung | 257/686 |
| 6,482,680 | B1 | 11/2002 | Khor et al. | 438/123 |
| 6,486,005 | B1 | 11/2002 | Kim | |
| 6,498,099 | B1 | 12/2002 | McLellan et al. | 438/689 |
| 6,498,392 | B2 | 12/2002 | Azuma | 257/676 |
| 6,507,096 | B2 | 1/2003 | Gang | 257/678 |
| 6,507,120 | B2 | 1/2003 | Lo et al. | 257/778 |
| 6,521,530 | B2 | 2/2003 | Peters et al. | 438/667 |
| 6,524,885 | B2 | 2/2003 | Pierce | 438/106 |
| 6,534,849 | B1 | 3/2003 | Gang | 257/678 |
| 6,545,332 | B2 | 4/2003 | Huang | 257/433 |
| 6,545,345 | B1 | 4/2003 | Glenn et al. | 257/676 |
| 6,548,898 | B2 * | 4/2003 | Matsuki et al. | 257/746 |
| 6,549,891 | B1 * | 4/2003 | Rauber et al. | 705/28 |
| 6,559,525 | B2 | 5/2003 | Huang | 257/675 |
| 6,566,168 | B2 | 5/2003 | Gang | 438/112 |
| 6,583,503 | B2 | 6/2003 | Akram et al. | 257/686 |
| 6,593,645 | B2 | 7/2003 | Shih et al. | 257/686 |
| 6,603,196 | B2 | 8/2003 | Lee et al. | 257/676 |
| 6,624,005 | B1 | 9/2003 | DiCaprio et al. | 438/113 |
| 6,667,546 | B2 | 12/2003 | Huang et al. | 257/691 |
| 6,671,398 | B2 | 12/2003 | Reinhorn et al. | 382/145 |
| 6,727,576 | B2 | 4/2004 | Hedler et al. | 257/678 |
| 6,730,857 | B2 | 5/2004 | Konrad et al. | |
| 6,740,964 | B2 | 5/2004 | Sasaki | |
| 6,831,371 | B1 | 12/2004 | Huemoeller et al. | 257/778 |
| 6,838,776 | B2 | 1/2005 | Leal et al. | 257/783 |
| 6,845,554 | B2 | 1/2005 | Frankowsky et al. | 29/832 |
| 6,853,060 | B1 * | 2/2005 | Seok et al. | 257/678 |
| 6,905,914 | B1 | 6/2005 | Huemoeller et al. | 438/118 |
| 6,919,514 | B2 | 7/2005 | Konrad et al. | |
| 6,921,975 | B2 | 7/2005 | Leal et al. | 257/723 |
| 6,930,256 | B1 | 8/2005 | Huemoeller et al. | 174/260 |
| 7,015,075 | B2 | 3/2006 | Fay et al. | 438/127 |
| 7,041,534 | B2 | 5/2006 | Chao et al. | 438/114 |
| 7,129,158 | B2 | 10/2006 | Nakai | |
| 7,196,408 | B2 | 3/2007 | Yang et al. | |
| 7,202,107 | B2 | 4/2007 | Fuergut et al. | |
| 7,238,602 | B2 | 7/2007 | Yang | |

| | | |
|---|---|---|
| 7,242,081 B1 | 7/2007 | Lee |
| 7,262,081 B2 | 8/2007 | Yang et al. |
| 7,272,444 B2 | 9/2007 | Peterson et al. ............... 607/30 |
| 7,326,592 B2 | 2/2008 | Meyer et al. |
| 7,339,279 B2 | 3/2008 | Yang |
| 7,345,361 B2 | 3/2008 | Mallik et al. |
| 7,361,987 B2 | 4/2008 | Leal et al. |
| 7,372,151 B1 | 5/2008 | Fan et al. |
| 7,405,102 B2 | 7/2008 | Lee et al. |
| 7,405,484 B2* | 7/2008 | Usui et al. .................. 257/776 |
| 7,408,261 B2* | 8/2008 | Yoon et al. .................. 257/737 |
| 7,459,781 B2 | 12/2008 | Yang et al. |
| 7,692,286 B1 | 4/2010 | Huemoeller et al. |
| 7,714,431 B1 | 5/2010 | Huemoeller et al. |
| 2001/0008305 A1 | 7/2001 | McLellan et al. ............ 257/692 |
| 2001/0011654 A1 | 8/2001 | Schmidt et al. ............. 219/746 |
| 2001/0012704 A1 | 8/2001 | Eldridge |
| 2001/0014538 A1 | 8/2001 | Kwan et al. .................. 438/690 |
| 2002/0024122 A1 | 2/2002 | Jung et al. .................... 257/666 |
| 2002/0027297 A1 | 3/2002 | Ikenaga et al. .............. 257/784 |
| 2002/0061642 A1 | 5/2002 | Haji et al. .................... 438/613 |
| 2002/0140061 A1 | 10/2002 | Lee .............................. 257/666 |
| 2002/0140068 A1 | 10/2002 | Lee et al. ..................... 257/676 |
| 2002/0163015 A1 | 11/2002 | Lee et al. ..................... 257/200 |
| 2003/0013232 A1 | 1/2003 | Towle et al. ................ 438/113 |
| 2003/0030131 A1 | 2/2003 | Lee et al. ..................... 257/666 |
| 2003/0064548 A1 | 4/2003 | Isaak |
| 2003/0073265 A1 | 4/2003 | Hu et al. ...................... 438/123 |
| 2003/0134455 A1 | 7/2003 | Cheng et al. ................. 438/125 |
| 2004/0004293 A1* | 1/2004 | Murayama ................... 257/780 |
| 2004/0026781 A1* | 2/2004 | Nakai ........................... 257/737 |
| 2004/0046244 A1* | 3/2004 | Nakamura et al. ........... 257/700 |
| 2004/0056277 A1 | 3/2004 | Karnezos ..................... 257/200 |
| 2004/0061212 A1 | 4/2004 | Karnezos ..................... 257/686 |
| 2004/0061213 A1 | 4/2004 | Karnezos ..................... 257/686 |
| 2004/0063242 A1 | 4/2004 | Karnezos ..................... 438/106 |
| 2004/0063246 A1 | 4/2004 | Karnezos ..................... 438/108 |
| 2004/0113260 A1* | 6/2004 | Sunohara et al. ............ 257/698 |
| 2005/0001309 A1* | 1/2005 | Tanaka et al. ............... 257/700 |
| 2005/0242425 A1 | 11/2005 | Leal et al. .................... 257/690 |
| 2005/0266608 A1* | 12/2005 | Ho et al. ...................... 438/106 |
| 2005/0282314 A1 | 12/2005 | Lo et al. ....................... 438/117 |
| 2006/0145343 A1* | 7/2006 | Lee et al. ..................... 257/737 |
| 2006/0192301 A1 | 8/2006 | Leal et al. |
| 2006/0209497 A1* | 9/2006 | Ooi et al. ..................... 361/600 |
| 2006/0225918 A1* | 10/2006 | Chinda et al. ................ 174/260 |
| 2006/0231958 A1 | 10/2006 | Yang |
| 2006/0243478 A1* | 11/2006 | Inagaki et al. ............... 174/255 |
| 2006/0284309 A1* | 12/2006 | Park et al. .................... 257/731 |
| 2007/0059866 A1 | 3/2007 | Yang et al. |
| 2007/0273049 A1 | 11/2007 | Khan et al. |
| 2007/0290376 A1 | 12/2007 | Zhao et al. |
| 2008/0105967 A1 | 5/2008 | Yang et al. |
| 2008/0128884 A1 | 6/2008 | Meyer et al. |
| 2008/0142960 A1 | 6/2008 | Leal et al. |
| 2008/0182363 A1 | 7/2008 | Amrine et al. |
| 2008/0230887 A1 | 9/2008 | Sun et al. |
| 2009/0051025 A1 | 2/2009 | Yang et al. |

FOREIGN PATENT DOCUMENTS

| | | |
|---|---|---|
| EP | 0 393 997 | 10/1990 |
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2001-118947 | 4/2001 |
| JP | 2002-043497 | 2/2002 |
| KR | 1994-0001979 | 1/1994 |
| KR | 10-0220154 | 6/1999 |
| KR | 2002-0049944 | 6/2002 |
| KR | 2004-0012028 | 2/2004 |
| WO | WO 99/56316 | 11/1999 |
| WO | WO 99/67821 | 12/1999 |

OTHER PUBLICATIONS

Huemoeller et al., U.S. Appl. No. 11/605,740, filed Nov. 28, 2006, entitled "Electronic Component Package Comprising Fan-Out and Fan-In Traces".

Huemoeller et al., U.S. Appl. No. 11/784,979, filed Apr. 9, 2007, entitled "Two-Sided Wafer Escape Package".

Berry et al., U.S. Appl. No. 11/810,799, filed Jun. 6, 2006, entitled "Direct-Write Wafer Level Chip Scale Package".

Huemoeller et al., "Two-Sided Fan-Out Wafer Escape Package", U.S. Appl. No. 12/221,797, filed Aug. 5, 2008.

Huemoeller et al., U.S. Appl. No. 11/123,605, filed on May 5, 2005, entitled "Wafer Level Package and Fabrication Method".

Huemoeller et al., U.S. Appl. No. 11/297,050, filed on Dec. 7, 2005, entitled "Stacked Embedded Leadframe".

Huemoeller et al., "Embedded Electronic Component Package Fabrication Method", U.S. Appl. No. 12/459,532, filed Jul. 2, 2009.

Berry et al., "Thin Stacked Interposer Package", U.S. Appl. No. 11/865,617, filed Oct. 1, 2007.

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

Berry et al., "Direct-Write Wafer Level Chip Scale Package", U.S. Appl. No. 11/289,826, filed Nov. 29, 2005.

Berry et al., "Direct-Write Wafer Level Chip Scale Package", U.S. Appl. No. 12/661,597, filed Mar. 19, 2010.

Huemoeller et al., "Electronic Component Package Comprising Fan-Out Traces", U.S. Appl. No. 12/661,604, filed Mar. 19, 2010.

Huemoeller et al., U.S. Appl. No. 11/047,848, filed Jan. 31, 2005, entitled "Two-Sided Wafer Escape Package".

Huemoeller et al., U.S. Appl. No. 11/298,016, filed Dec. 8, 2005, entitled "Embedded Electronic Component Package".

Huemoeller et al., U.S. Appl. No. 10/261,868, filed Oct. 1, 2002, entitled "Integrated Circuit Film Substrate Having Embedded Conductive Patterns and Vias".

Huemoeller et al., U.S. Appl. No. 10/297,050, filed Dec. 7, 2005, entitled "Stacked Embedded Leadframe".

* cited by examiner

US 7,902,660 B1

SUBSTRATE FOR SEMICONDUCTOR DEVICE AND MANUFACTURING METHOD THEREOF

BACKGROUND OF THE INVENTION

1. Field of the Invention

The present invention relates to substrate for semiconductor device and manufacturing method thereof, and semiconductor device using the same and manufacturing method thereof.

2. Description of the Related Art

Generally, a semiconductor device includes a substrate having a plurality of electrically conductive patterns thereon, a semiconductor die located on the substrate, a plurality of conductive connecting means for electrically connecting the substrate to the semiconductor die, and an encapsulant for encapsulating the semiconductor die and the conductive connecting means. Here, a plurality of solder balls can be further fused to the substrate so as to electrically connect the semiconductor device to an external device.

Meanwhile, a relatively thick core layer is formed at the substrate of the semiconductor device, in order that a warpage is not generated during the manufacturing process of the semiconductor device. That is, the general substrate includes the core layer having a thickness of approximately 800 μm formed at the center thereof and a plurality of relatively thin build-up layers formed at top and bottom surfaces of the core layer. Here, a plurality of electrically conductive patterns is formed at the core layer and the build-up layers. Also, a plurality of via holes passes through the core layer and the build-up layers in order to electrically connect the electrically conductive pattern layers to each other.

However, since such substrate is comparatively thicker, there is a defect in that the thickness of the semiconductor device using the substrate becomes thicker. Also, because each electrically conductive pattern of the substrate is comparatively longer, there is a defect in that the electrical efficiency of the semiconductor device using the electrically conductive patterns is deteriorated. Especially, recent semiconductor devices have been required to have a wide bandwidth, fast data transferring, and higher density structure. However, it is difficult for the general substrate to implement recent trends thereof.

Here, it can solve the problems by eliminating the core layer from the substrate. However, where the core layer is eliminated from the substrate, since the warpage phenomenon is very higher during the manufacturing process of the semiconductor, it is difficult to manufacturer the semiconductor device. Also, it is difficult to manufacture and handle the substrate owing to the low stiffness thereof.

SUMMARY OF THE INVENTION

A substrate for a semiconductor device and a manufacturing thereof, and a semiconductor device using the same and a manufacturing method thereof are disclosed. For example, in the substrate according to the present invention, a core is eliminated, so that the substrate has a very thin thickness, as well, the length of electrically conductive patterns becomes shorter, whereby the electrical efficiency thereof is improved. Moreover, since a carrier having a stiffness of a predetermined strength is bonded on the substrate, it can prevent a warpage phenomenon during the manufacturing process of the semiconductor device. Furthermore, the carrier is removed from the substrate, whereby a solder ball fusing process or an electrical connecting process of the semiconductor die can be easily performed.

The present invention is best understood by reference to the following detailed description when read in conjunction with the accompanied drawings.

BRIEF DESCRIPTION OF THE DRAWINGS

FIG. 1A illustrates a carrier providing operation;

FIG. 1P illustrates a third photo sensitive film eliminating operation;

FIG. 2A illustrates a semiconductor die attaching operation;

FIG. 2B illustrates a wire bonding operation;

FIG. 2C illustrates an encapsulating operation;

FIG. 2D illustrates a carrier eliminating operation;

FIG. 2E illustrates a solder ball fusing operation;

FIG. 3A illustrates a flip chip bonding operation;

FIG. 3B illustrates an underfilling operation;

FIG. 3C illustrates an encapsulating operation;

FIG. 3D illustrates a carrier eliminating operation;

FIG. 3E illustrates a solder ball fusing operation;

FIG. 4A illustrates a multi layer forming operation;

FIG. 4B illustrates a solder mask printing operation;

FIG. 4C illustrates a solder mask exposing/developing operation;

FIG. 4D illustrates a photo sensitive film providing operation;

FIG. 4E illustrates a plating operation;

FIG. 4F illustrates a photo sensitive film eliminating operation;

FIG. 5A illustrates a flip chip bonding operation;
FIG. 5B illustrates an underfilling operation;
FIG. 5C illustrates an encapsulating operation;
FIG. 5D illustrates a carrier eliminating operation;
FIG. 5E illustrates a solder ball fusing operation;

FIG. 6A illustrates a carrier eliminating operation;
FIG. 6B illustrates a flip chip bonding operation;
FIG. 6C illustrates an underfilling operation;
FIG. 6D illustrates an encapsulating operation;
FIG. 6E illustrates a solder ball fusing operation;

FIG. 7A illustrates a carrier eliminating operation;
FIG. 7B illustrates a flip chip bonding operation;
FIG. 7C illustrates an underfilling operation;
FIG. 7D illustrates an encapsulating operation; and
FIG. 7E illustrates a solder ball fusing operation.

Common reference numerals are used throughout the drawings as well, detailed descriptions are used to indicate like elements.

DETAILED DESCRIPTION

Figure 1:
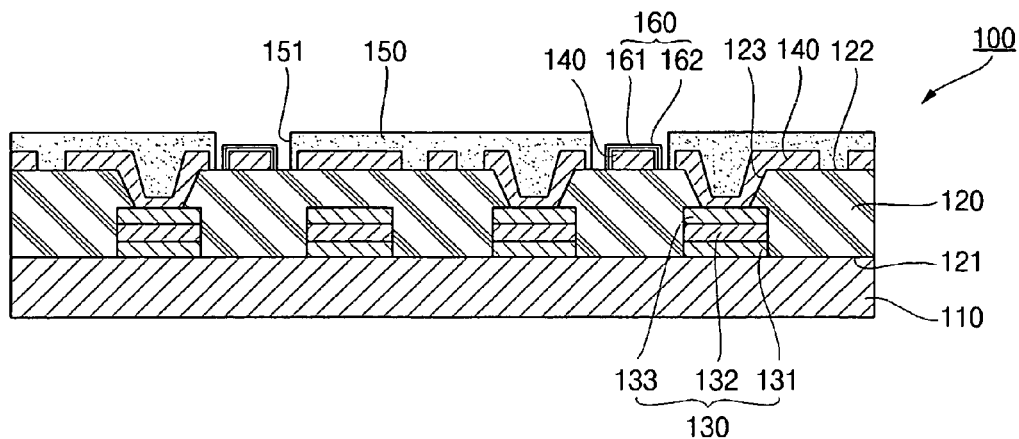
FIG. 1 is a sectional view of a substrate for a semiconductor device according to one embodiment of the present invention.

Referring to FIG. 1, a sectional view of a substrate 100 for a semiconductor device according to one embodiment of the present invention is illustrated.

As shown in FIG. 1, the substrate 100 for a semiconductor device includes a carrier 110 having a predetermined stiffness, a dielectric layer 120 formed on the carrier 110, a plurality of conductive lands 130 electrically connected to the carrier 110 at the inside of the dielectric layer 120, a plurality of electrically conductive patterns 140 electrically connected to the conductive lands 130 at the surface of the dielectric layer 120, and a solder mask 150 for covering the dielectric layer 120 and the electrically conductive patterns 140, a predetermined area of each conductive pattern 140 being exposed to outside.

The carrier 110 is in the form of an approximately planar plate. The material of the carrier 110 may be a metal, a film or its equivalent, in order that a warpage is not generated during the manufacturing process of the semiconductor device. However, the present invention is not limited to any material of the carrier 110. Moreover, in case of the metal as the material of the carrier 110, the material of the carrier 110 may be a copper, an aluminum, a nickel or its equivalent. However, the present invention is not limited to any metal material of the carrier 110.

The dielectric layer 120 of a predetermined thickness is formed on the surface of one side of the carrier 110. The dielectric layer 120 includes a first surface 121 of an approximate planar surface bonded on the carrier 110 and a second surface 122 of an approximate planar surface opposed to the first surface 121. Also, a plurality of via holes 123 of a predetermined depth is further formed at the second surface 122 of the dielectric layer 120, in order to electrically connect the electrically conductive patterns 140 to the conductive lands 130. The material of the dielectric layer 120 may be a prepreg and an ABF (Ajinomoto Buildup Film) of a low dielectric constant or its equivalent, in order to decrease the capacitance of the electrically conductive patterns 140 and so on. However, the present invention is not limited to any material of the dielectric layer 120. Moreover, the thickness of the dielectric layer 120 is approximately 10~150 μm, so that it has a very thin thickness in comparison with the conventional substrate having a core layer.

Each of conductive lands 130 formed at the inside of the dielectric layer 120 have a bottom surface flush (substantially coplanar) with the first surface 121 of the dielectric layer 120. That is, the conductive lands 130 are electrically connected to the carrier 110. Also, the conductive land 130, that is, a copper layer 131, a gold layer 132, another copper layer 133 may be plated on the carrier 110 in order. However, the present invention is not limited to any material of the conductive land 130.

The plurality of electrically conductive patterns 140 are formed at the second surface 122 of the dielectric layer 120. Here, the plurality of electrically conductive patterns 140 is electrically connected to the conductive lands 130 through the via holes 123 formed at the dielectric layer 120. The material of electrically conductive patterns 140 may be a copper or its equivalent. However, the present invention is not limited to any material of the electrically conductive patterns 140.

The solder mask 150 is coated on the second surface 122 of the dielectric layer 120 in order to cover the electrically conductive patterns 140. Here, a plurality of openings 151 are formed at the solder mask 150, so that a predetermined area of each electrically conductive pattern 140 is exposed to outside. Also, a plurality of bonding pads 160 are formed at the electrically conductive patterns 140 exposed to outside through the openings 151. A semiconductor die will be electrically connected to the bonding pad 160 in future. Also, the bonding pad 160, that is, a nickel layer 161 and a gold layer 162 may be plated on the electrically conductive pattern 140 in order. However, the present invention is not limited to any material of the bonding pad 160.

Figure 1A:
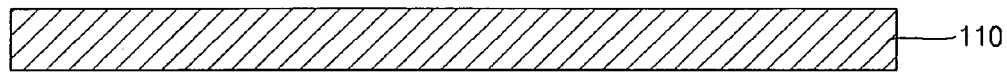
FIG. 1A through FIG. 1P are sectional views showing a fabrication method of the substrate for a semiconductor device according to one embodiment of the present invention where.
Figure 1B:
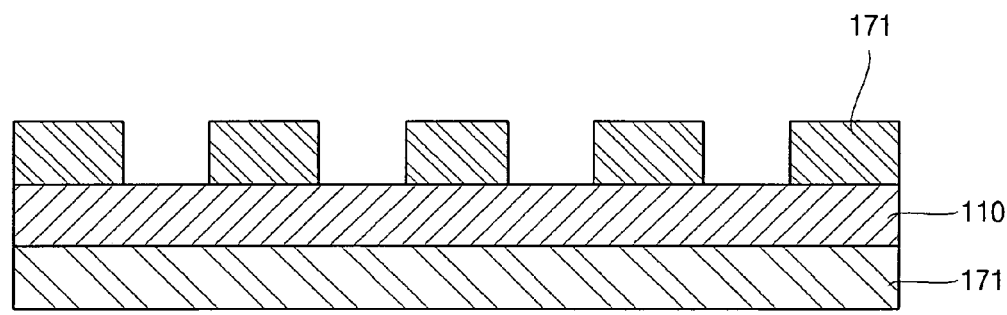
FIG. 1B illustrates a first photo sensitive film providing operation.
Figure 1C:
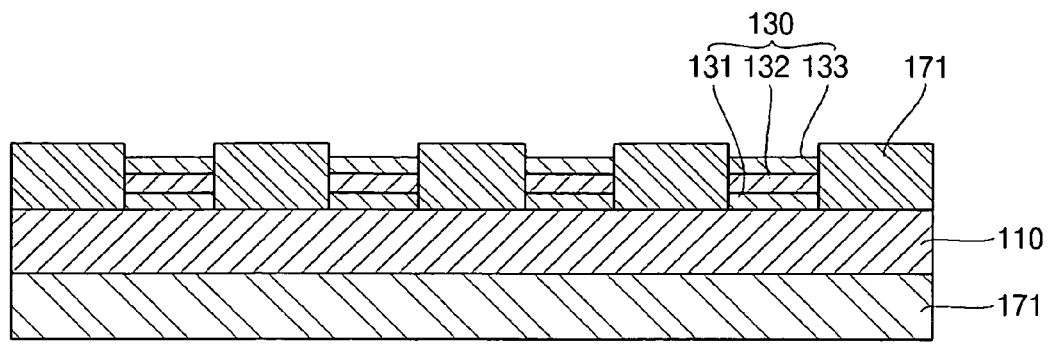
FIG. 1C illustrates a first plating operation.
Figure 1D:
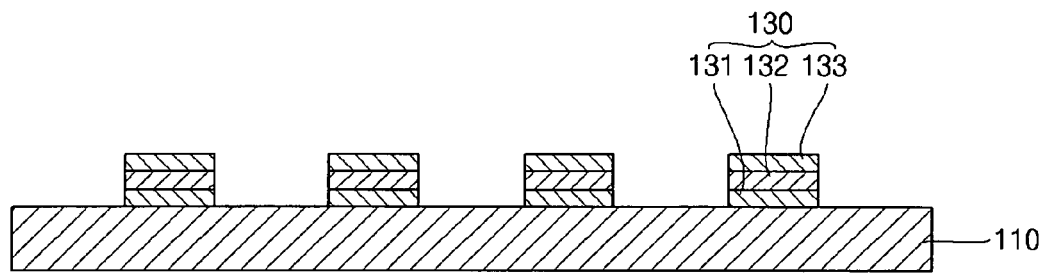
FIG. 1D illustrates a first photo sensitive film eliminating operation.
Figure 1E:
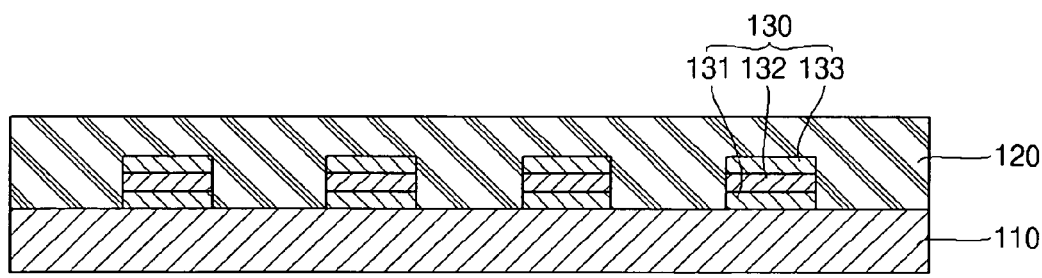
FIG. 1E illustrates a dielectric layer forming operation.
Figure 1F:
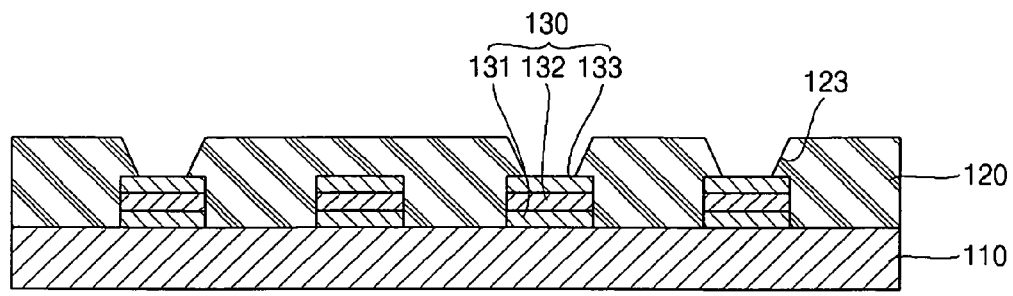
FIG. 1F illustrates a via hole forming operation.
Figure 1G:
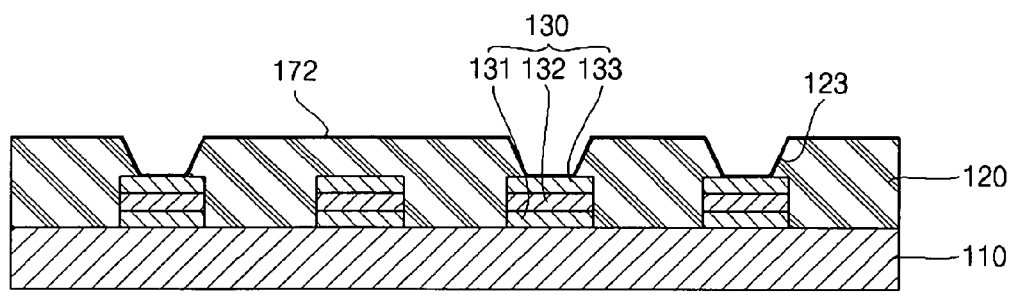
FIG. 1G illustrates a second plating operation.
Figure 1H:
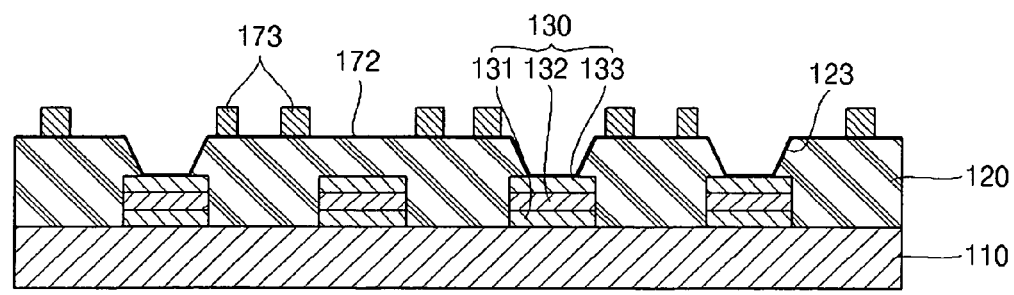
FIG. 1H illustrates a second photo sensitive film providing operation.
Figure 1I:
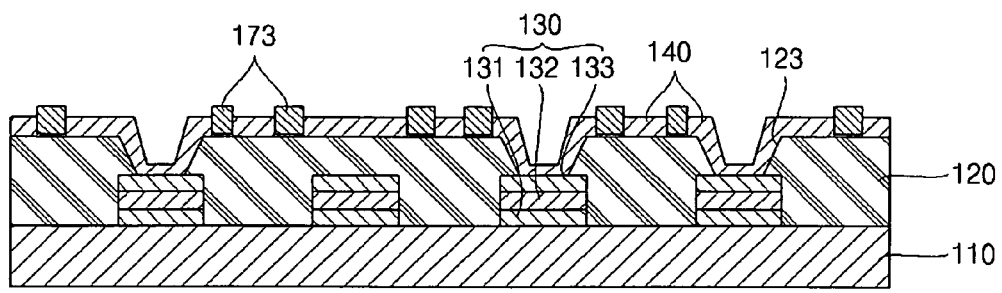
FIG. 1I illustrates a third plating operation.
Figure 1J:
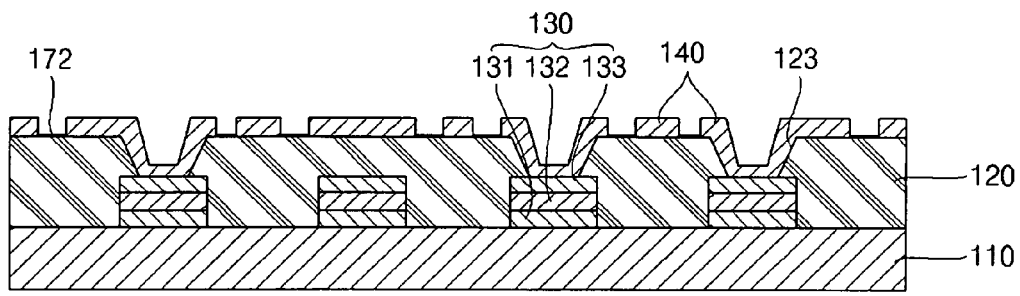
FIG. 1J illustrates a second photo sensitive film eliminating operation.
Figure 1K:
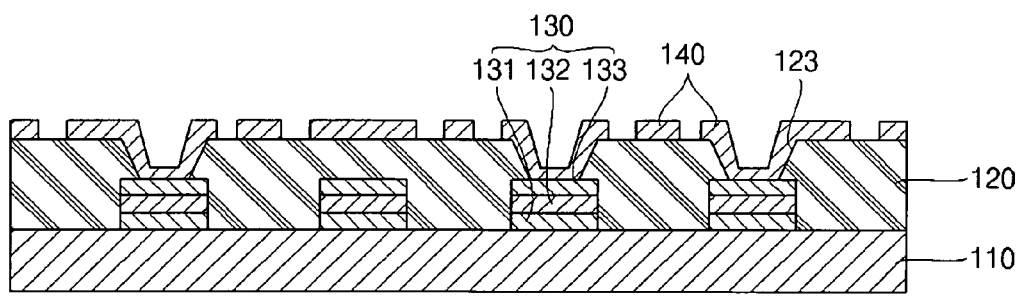
FIG. 1K illustrates an etching operation.
Figure 1L:
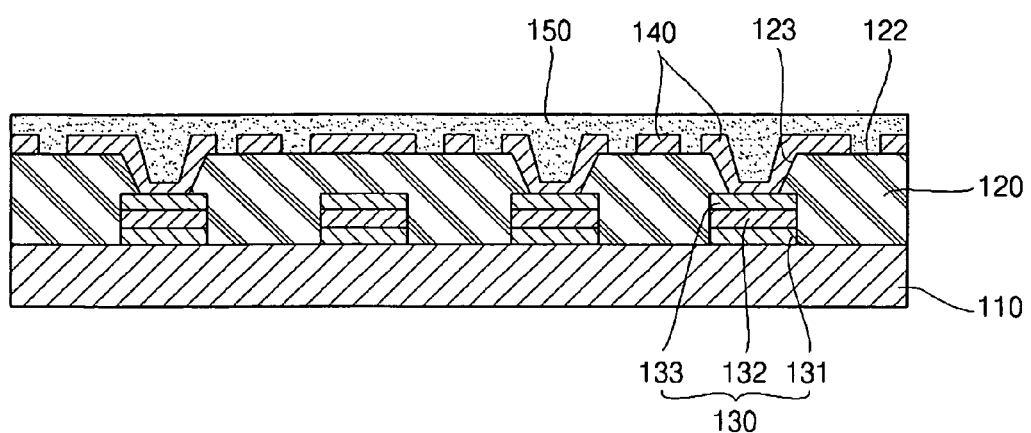
FIG. 1L illustrates a solder mask printing operation.
Figure 1M:
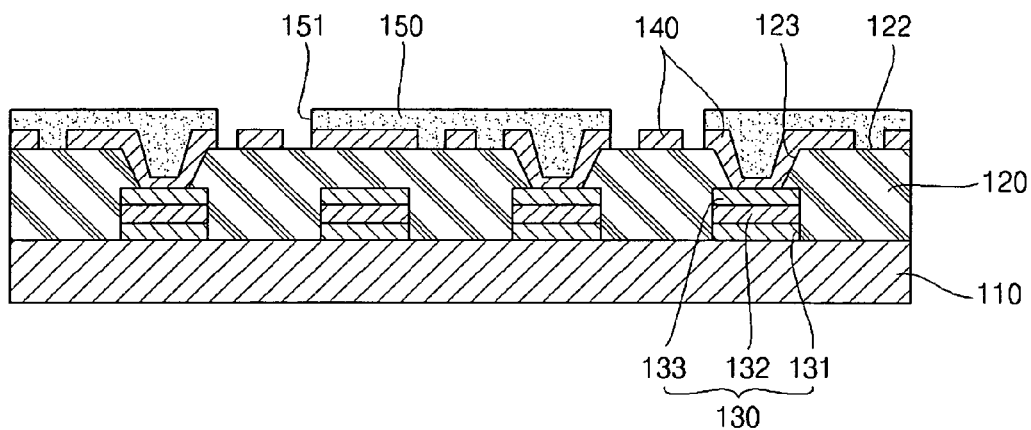
FIG. 1M illustrates a solder mask exposing/developing operation.
Figure 1N:
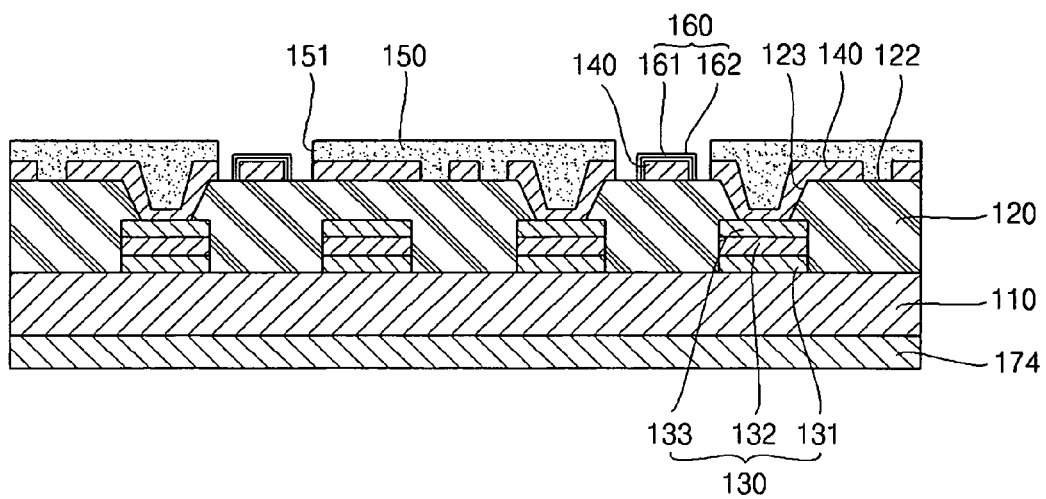
FIG. 1N illustrates a third photo sensitive film providing operation.
Figure 1O:
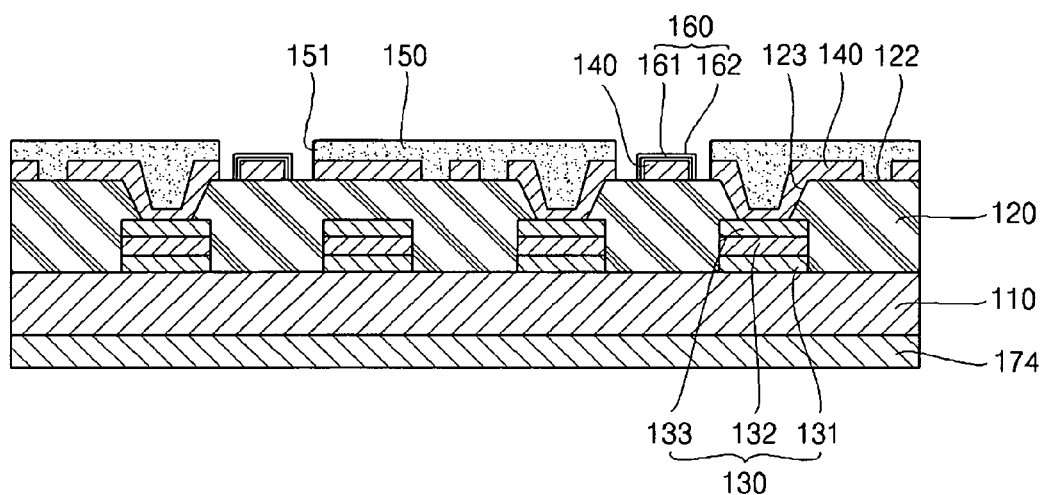
FIG. 1O illustrates a fourth plating operation.
Figure 1P:
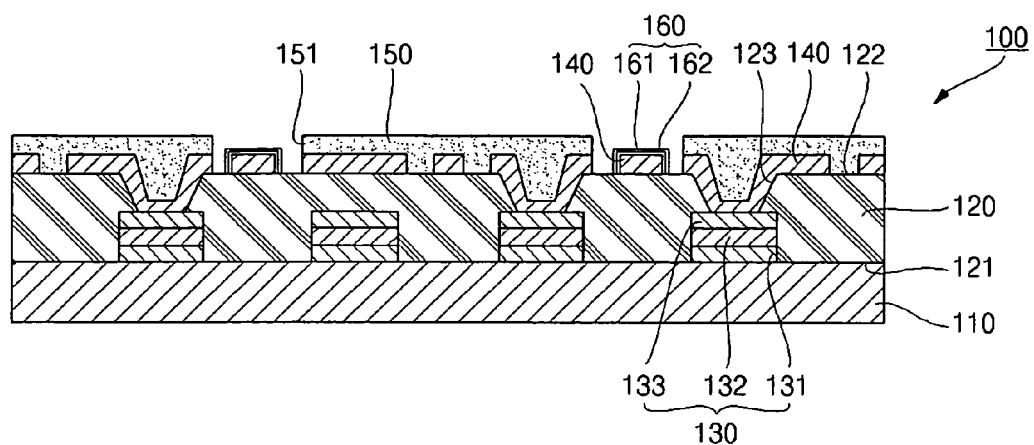

Referring to FIG. 1A through FIG. 1P, sectional views showing a fabrication method of the substrate 100 for a semiconductor device according to one embodiment of the present invention is illustrated.

As shown in the drawings, the fabrication method of the substrate 100 for a semiconductor device according to the present invention includes a carrier providing operation, a first photo sensitive film providing operation, a first plating operation, a first photo sensitive film eliminating operation, a dielectric layer forming operation, a via hole forming operation, a second plating operation, a second photo sensitive film providing operation, a third plating operation, a second photo sensitive film eliminating operation, an etching operation, a solder mask printing operation, a solder mask exposing/developing operation, a third photo sensitive film providing operation, a fourth plating operation, and a third photo sensitive film eliminating operation.

As shown in FIG. 1A, in the carrier providing operation, the carrier 110 of an approximately planar plate is provided. The material of the carrier 110 may be a metal, a film or its equivalent, in order that a warpage is not generated during the manufacturing process of the semiconductor device, as described above. However, the present invention is not limited to any material of the carrier 110. Moreover, in case of the metal as the material of the carrier 110, the material of the carrier 110 may be a copper, an aluminum, a nickel or its equivalent. However, the present invention is not limited to any metal material of the carrier 110.

As shown in FIG. 1B, in the first photo sensitive film providing operation, the photo sensitive film 171 of a predetermined pattern is formed at the top surface and the bottom surface of the carrier 110. That is, the photo sensitive film 171, on which any pattern is not formed, is bonded or coated on the top surface and the bottom surface of the carrier 110 and then, only the photo sensitive film 171 having a predetermined pattern is left over the top surface of the carrier 110 through the exposing/developing process. Here, the predetermined region of the carrier 110 is exposed to outside through the photo sensitive film 171.

As shown in FIG. 1C, in the first plating operation, the plurality of conductive lands 130 are formed. That is, the copper layer 131, the gold layer 132 and another copper layer 133 are plated on the top surface of the carrier 110 exposed to outside through the photo sensitive film 171 in order, thereby forming the conductive lands 130 of a predetermined thickness.

As shown in FIG. 1D, in the first photo sensitive film eliminating operation, the photo sensitive film 171 left over the carrier 110 is eliminated by a chemical etching and the like. Here, like this, only the plurality of conductive lands 130 is left over the carrier 110. Also, the carrier 110 except for the conductive lands 130 is exposed to outside.

As shown in FIG. 1E, in the dielectric layer forming operation, the dielectric layer 120 of a predetermined thickness is coated and hardened so as to cover the conductive lands 130 formed at the carrier 110 all together. Here, the material of the dielectric layer 120 may be a prepreg and an ABF (Ajinomoto Buildup Film) of a low dielectric constant or its equivalent, in order to decrease the capacitance of the electrically conductive patterns 140 and so on. However, the present invention is not limited to any material of the dielectric layer 120. Moreover, the carrier 110 has an adequate stiffness, so that the warpage is not generated during the manufacturing process of the semiconductor device, thereby the dielectric layer 120 has very thin thickness of 10~150 μm.

As shown in FIG. 1F, in the via hole forming operation, the via holes 123 of a predetermined depth are formed in such a manner that the conductive lands 130 formed at both the surface of the carrier 110 and the inside of the dielectric layer 120 are exposed to outside. That is, the dielectric layer 120 corresponding to the conductive lands 130 is eliminated by a laser drilling, a mechanical drilling or an etching and so on, so that the via holes 123 of a predetermined depth are formed. Here, the predetermined region of each conductive lands 130 is exposed to outside through the via holes 123.

As shown in FIG. 1G, in the second plating operation, an electroless plating layer 172, sometimes called a seed layer, of a thin thickness is formed at the surface of the dielectric layer 120 and the surface of the conducive lands 130 exposed to outside through the via holes 123. The electroless plating layer 172 can be formed by means of a conventional electroless plating process. Also, the thickness of the electroless plating layer 172 is in the range of several μm.

As shown in FIG. 1H, in the second photo sensitive film providing operation, the photo sensitive film 173 of a predetermined pattern is formed at the surface of the electroless plating layer 172 again. Here, it is suited that the photo sensitive film 173 is not formed at the regions corresponding to the via holes 123, so as to electrically connect the electrically conductive patterns 140 and the conductive lands 130 each other. Also, the photo sensitive film 173, on which any pattern is not formed, is bonded or coated on the surface of the electroless plating layer 172 and then, only the photo sensitive film 173 having a predetermined pattern is left over the surface of the electroless plating layer 172 through the exposing/developing process. Here, the predetermined region of the electroless plating layer 172 is exposed to outside through the photo sensitive film 173.

As shown in FIG. 1I, in the third plating operation, an electrolytic plating layer of a predetermined thickness is formed at the electroless plating layer exposed to outside through the photo sensitive film 173. The electrolytic plating layer is the electrically conductive pattern 140 in fact. The electrolytic plating layer can be formed by means of a conventional electrolytic plating process, thereby obtaining the electrically conductive pattern 140 of desiring thickness.

As shown in FIG. 1J, in the second photo sensitive film eliminating operation, the photo sensitive film 173 formed on the electroless plating layer 172 is eliminated by a chemical etching and the like. Here, like this, the electroless plating layer 172 located at the lower portion of the photo sensitive film 173 is exposed to outside. Also, all of the electrically conductive patterns 140 continuously maintain a short status on account of the electroless plating layer 172.

As shown in FIG. 1K, in the etching operation, all electroless plating layers 172 left between the electrically conductive patterns 140 are eliminated by the chemical etching process. Here, since the electroless plating layer 172 has very thin thickness of several μm, it can be easily eliminated through a weak acid.

As shown in FIG. 1L, in the solder mask printing operation, the solder mask 150 of a predetermined thickness is printed on the dielectric layer 120 in order to cover the electrically conductive patterns 140. The material of the solder mask 150 may be photosensitivity or insensitivity. The solder mask 150 serves to prevent the oxidation of the electrically conductive patterns 140 and its damage from the external impact during the manufacturing process of the semiconductor device.

As shown in FIG. 1M, in the solder mask exposing/developing operation, a predetermined region of the solder mask 150 is eliminated by the exposing/developing process. That is, the plurality of openings 151 are formed at the solder mask 150, so that a predetermined area of each electrically conductive pattern 140 is exposed to outside.

As shown in FIG. 1N, in the third photo sensitive film providing operation, the photo sensitive film 174 of a predetermined pattern is formed at the bottom surface of the carrier 110. Here, since the photo sensitive film 174 serves to prevent the plating layer from formed at the bottom surface of the carrier 110 during the plating process, the material of the photo sensitive film 174 may not be photosensitivity.

As shown in FIG. 1O, in the fourth plating operation, the plurality of bonding pads 160 is formed at predetermined regions of the electrically conductive patterns 140 exposed to outside through the solder mask 150. The plurality of bonding pads 160 can be formed by means of the electrolytic plating process. That is, the nickel layer 161 and the gold layer 162 may be plated on the electrically conductive pattern 140 of a predetermined region exposed to outside through the solder mask 150, thereby forming the bonding pad 160 of a predetermined thickness. The bonding pad 160 serves to electrically connect with the semiconductor die during manufacturing process of the semiconductor device.

As shown in FIG. 1P, in the third photo sensitive film eliminating operation, the photo sensitive film 174 formed on the bottom surface of the carrier 110 is eliminated by a chemical etching and the like, thereby completing the substrate 100 according to the present invention. Here, the bottom surface of the carrier 110 is exposed to outside through the photo sensitive film elimination process.

Figure 2:
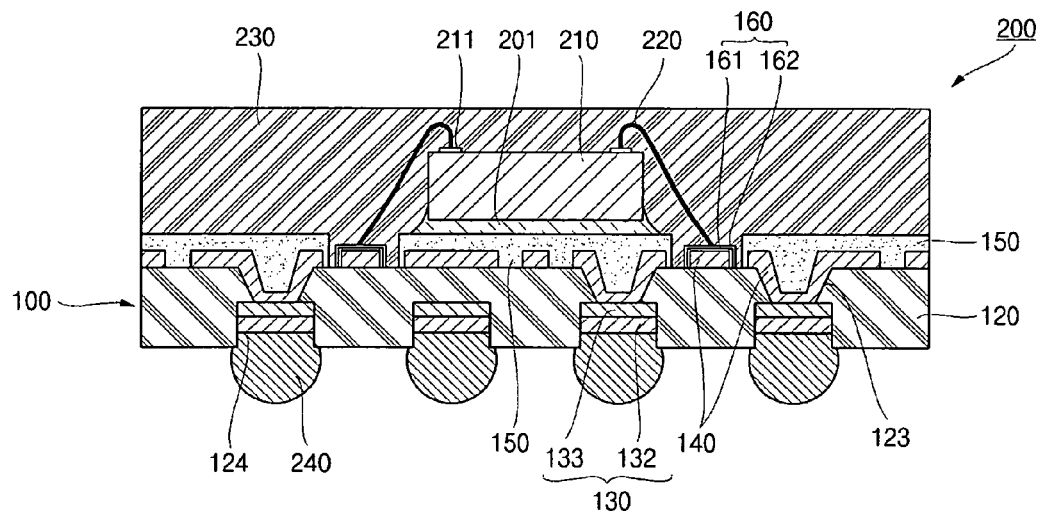
FIG. 2 is a sectional view of a semiconductor device according to one embodiment of the present invention.

Referring to FIG. 2, a sectional view of a semiconductor device 200 according to one embodiment of the present invention is illustrated.

As shown in FIG. 2, the semiconductor device 200 includes the above substrate 100, a semiconductor die 210 bonded to the substrate 100, a plurality of conductive connecting means 220 for electrically connecting the substrate 100 to the semiconductor die 200, an encapsulant 230 for encapsulating the semiconductor die 200 and the conductive connecting means 220, and a plurality of solder balls 240 fused to the substrate 100.

Firstly, the substrate 100 is actually similar to that of FIG. 1. However, the carrier 110 is removed from the substrate 100 and a predetermined region (the copper layer 131) is etched and eliminated. Accordingly, each conductive land 130 includes only the gold layer 132 and the copper layer 133. As described above, the substrate includes the dielectric layer 120, the plurality of conductive lands 130, the plurality of electrically conductive patterns 140, the bonding pads 160, and the solder mask 150. Since the structure and method of the substrate 100 is explained in full as described above, further description is omitted here.

The semiconductor die 210 is bonded to the surface of the solder mask 150 of the substrate 100 by means of an adhesive 201. Here, a plurality of I/O pads 211 is formed at the top surface of the semiconductor die 210.

The plurality of conductive connecting means 220 may be a conventional conductive wire. More concretely, it may be a gold wire, an aluminum wire or its equivalent. The connecting means 220 serves to electrically connect the bonding pads 160 of the substrate 100 to the I/O pads of the semiconductor die 210 each other.

The encapsulant 230 covers the semiconductor die 210 and the conductive connecting means 220, so that it serves to protect them from an external impact. Here, the encapsulant 230 covers the whole top surface of the substrate 100. Also, the material of the encapsulant 230 may be a plastic resin, a thermosetting resin, a ceramic, an epoxy molding compound or its equivalent. However, the present invention is not limited to any material of the encapsulant 230.

The plurality of solder balls 240 is fused to the conductive lands 130, that is, the gold layer 132 formed at the substrate 100. The solder ball 240 serves to mechanically and electrically connect the semiconductor device 200 to an external device, as well known. The bottom surface of the conductive land 130 is not flush with the substrate 100, that is, the bottom surface of the dielectric layer 120. That is, the bottom surface of the conductive land 130 is located at the inside of the dielectric layer 120. In other words, a recess 124 of a predetermined depth is formed at the inside of the dielectric layer 120 and the conductive land 130 is formed at the inside of the recess 124. Accordingly, the solder ball 240 is combined with the recess 124 and fused to the conductive land 130, the fusing status of the solder balls 240 is more strongly.

Referring to FIG. 2A through FIG. 2E, sectional views showing a fabrication method of the semiconductor device 200 according to one embodiment of the present invention is illustrated.

As shown in the drawings, the fabrication method of the semiconductor device 200 includes a substrate providing operation, a semiconductor die attaching operation, a connecting operation, an encapsulating operation, a carrier eliminating operation, and a solder ball fusing operation.

Figure 2A:
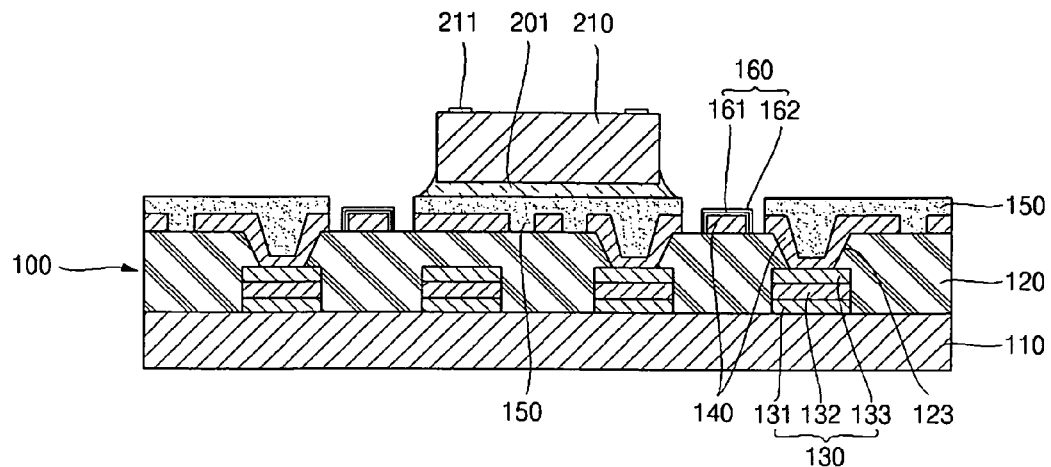
FIG. 2A through FIG. 2E are sectional views showing a fabrication method of the semiconductor device according to one embodiment of the present invention where.

As shown in FIG. 2A, in the substrate providing operation and the semiconductor die attaching operation, the substrate 100 having the carrier 110 at bottom surface thereof is provided. The semiconductor die 210 is bonded to the top surface of the substrate 100 by means of the adhesive 201. Here, The carrier 110 provides a predetermined stiffness, so that the warpage is not generated during the manufacturing process of the semiconductor device.

Figure 2B:
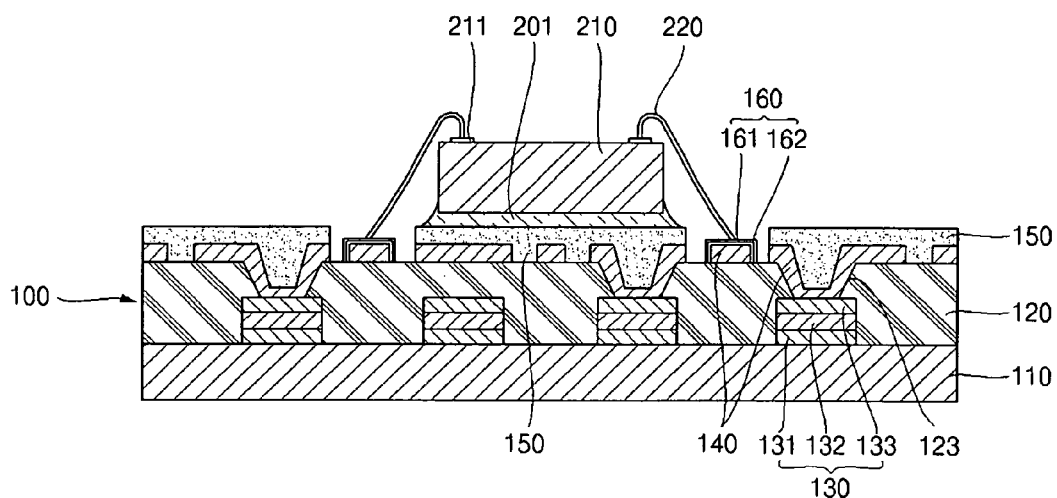

As shown in FIG. 2B, in the connecting operation, the bonding pads 160 of the substrate 100 and the I/O pads 211 of the semiconductor die 210 are electrically connected to each other by means of the connecting means 220, that is, conductive wires.

Figure 2C:
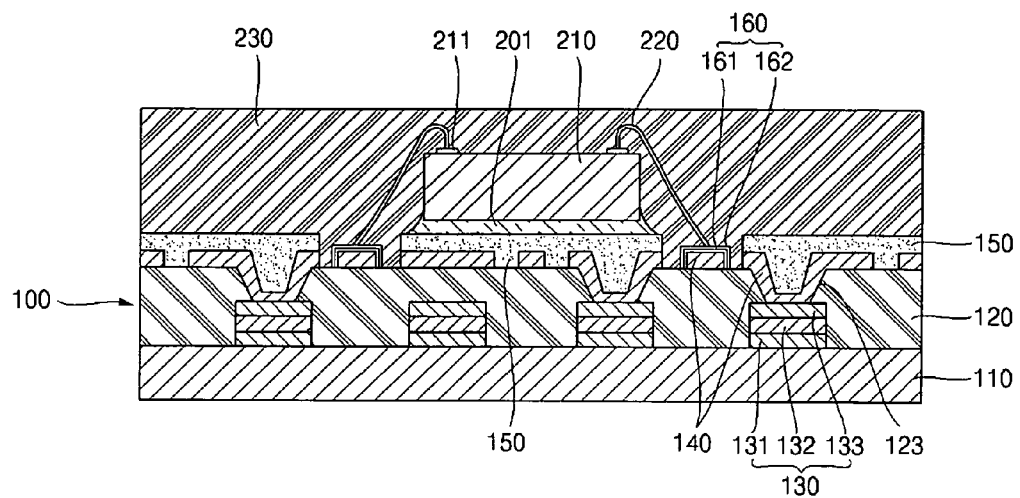

As shown in FIG. 2C, in the encapsulating operation, the semiconductor die 210 and the conductive connecting means 220 are encapsulated by the encapsulant 230. Here, the encapsulant 230 also, covers the whole top surface of the substrate 100.

Figure 2D:
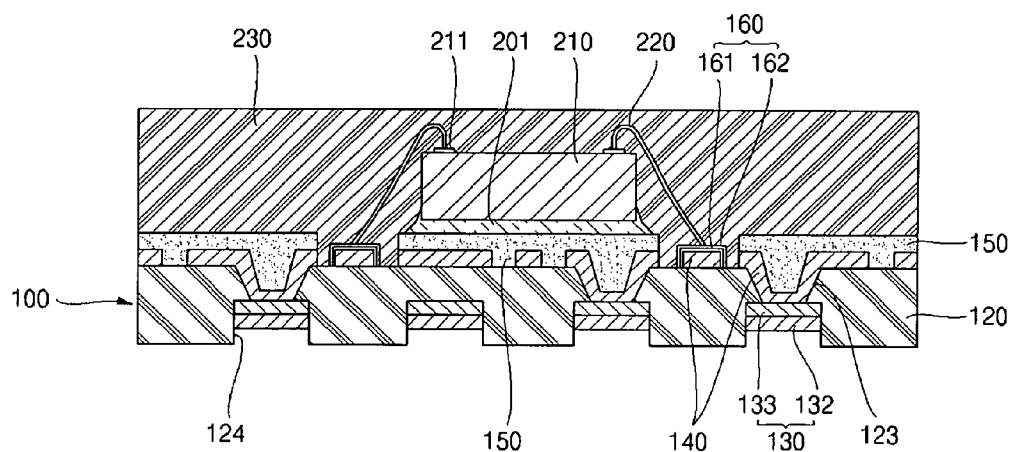

FIG. 2D shows carrier eliminating operation. If the carrier 110 is a metal, then the carrier 110 is completely eliminated by the chemical etching process. Accordingly, the bottom surface of the dielectric layer 120 of the substrate 100 is exposed to outside. Also, in the carrier eliminating operation by the chemical etching process, even the copper layer 131 of the conductive lands 130 of the substrate 100 is eliminated, so that the recess 124 of a predetermined depth is naturally formed at the dielectric layer 120 of the substrate 100. At this time, only the gold layer 132 and the copper layer 133 as the conductive land 130 are left over the inside of the recess 124.

However, if the carrier 110 is a film, then the carrier 110 is completely eliminated by the peeling off process (not shown). Accordingly, the bottom surface of the dielectric layer 120 of the substrate 100 is exposed to outside. Also, in the carrier eliminating operation by the peeling off process, the copper layer 131 of the conductive lands 130 of the substrate 100 is exposed to outside, unlike the above embodiment (not shown). That is, the recess 124 is not formed. Therefore, a bottom surface of the dielectric layer 120 may be flushed with a bottom surface of the copper layer 131.

Figure 2E:
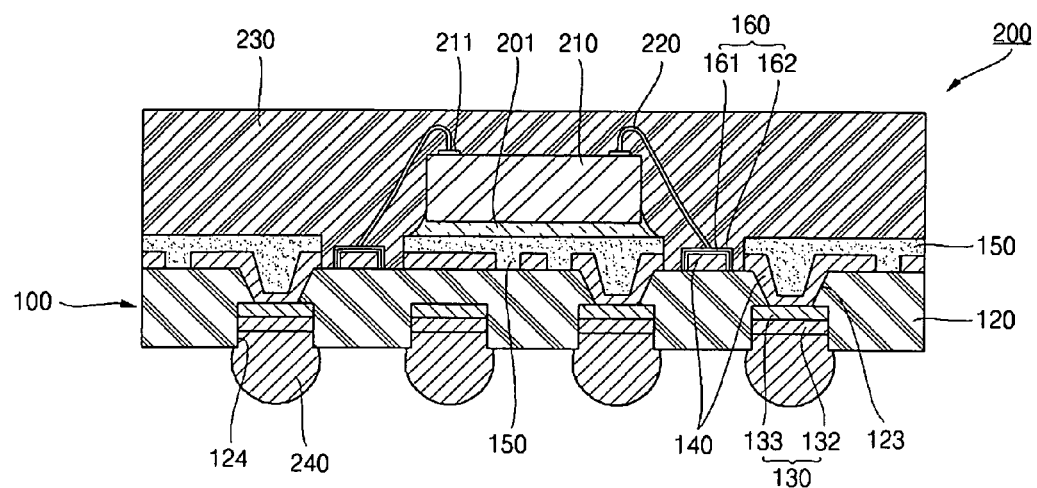

As shown in FIG. 2E, in the solder ball fusing operation, the plurality of solder balls 240 is fused to the recess 124 and the conductive lands 130 of the substrate 100, thereby completing the semiconductor device 200 according to the present invention. The solder ball fusing operation includes a flux applying process for applying a sticky flux to the conductive lands 130, an attaching process for temporarily attaching the solder balls 240 to the flux, and a reflowing process of high temperature.

Figure 3:
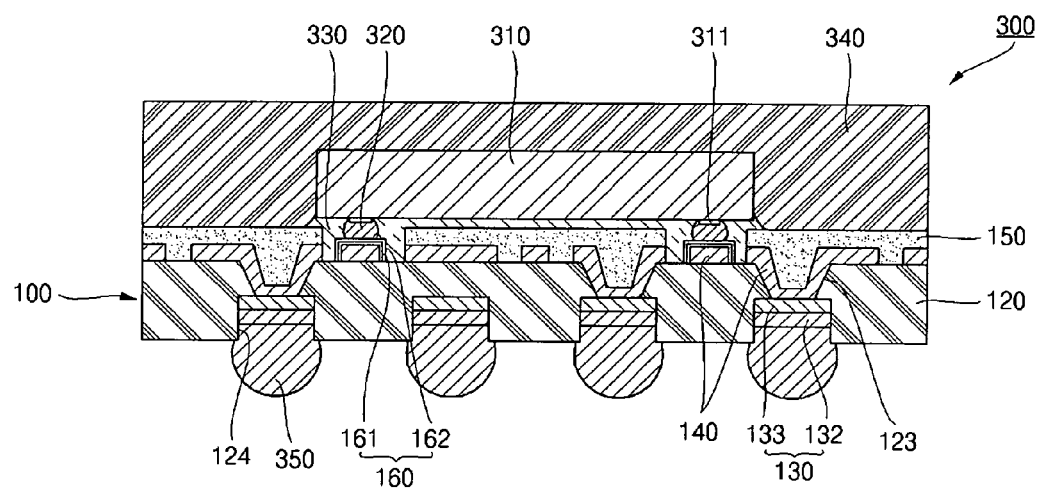
FIG. 3 is a sectional view of a semiconductor device according to another embodiment of the present invention.

Referring to FIG. 3, a sectional view of a semiconductor device 300 according to another embodiment of the present invention is illustrated.

Here, the semiconductor device 300 of FIG. 3 is almost similar to that of FIG. 2, the description of the similar parts is omitted here.

As shown in FIG. 3, the semiconductor die 310 can be connected to the substrate 100 in the form of a flip chip. That is, after solder bumps 320 are fused to I/O pads 311 of the semiconductor die, in a state that the semiconductor die 310 turns upside down, the solder bumps 320 can be connected to the bonding pads 160 of the substrate 100. Here, an underfill 330 is filling between the semiconductor die 310 and the substrate 100, so as to prevent the oxidation of the solder bump 320 and strength bonding force between the semiconductor die 310 and the substrate 100. Also, the peripheral of the semiconductor die 310 and the underfill 330 are encapsulated by an encapsulant 340, it can protect the semiconductor die 310 and so forth from the external impact. Here, a plurality of solder balls 350 is fused to conductive lands 130 of the substrate 100.

Referring to FIG. 3A through FIG. 3E, sectional views showing a fabrication method of the semiconductor device 300 according to another embodiment of the present invention is illustrated.

As shown in the drawings, the fabrication method of the semiconductor device 300 includes a substrate providing operation/a flip chip bonding operation, an underfilling operation, an encapsulating operation, a carrier eliminating operation, and a solder ball fusing operation.

Figure 3A:
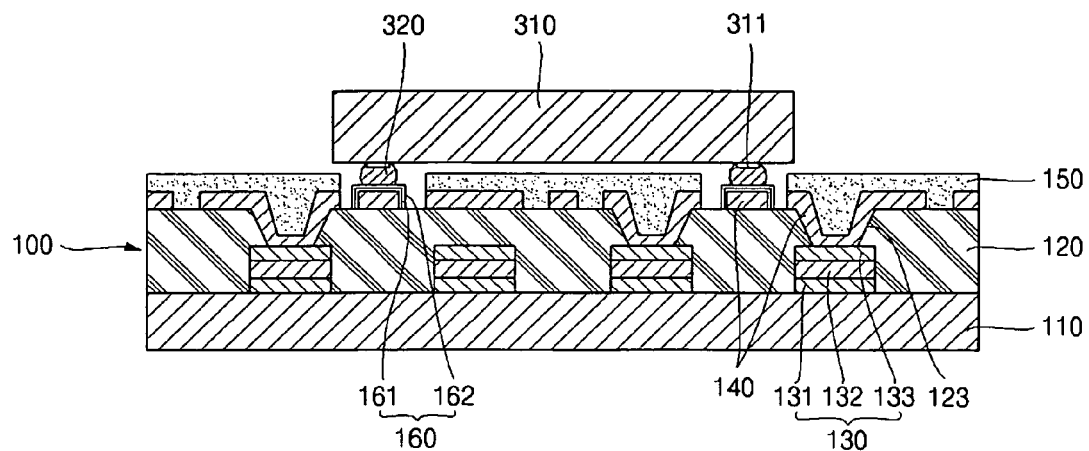
FIG. 3A through FIG. 3E are sectional views showing a fabrication method of the semiconductor device according to anther embodiment of the present invention where.

As shown in FIG. 3A, in the substrate providing operation/ the flip chip bonding operation, the substrate 100 having the carrier 110 at bottom surface thereof is provided. Thereafter, the semiconductor die 310 is bonded on the top surface of the substrate 100 in the form of a flip chip. That is, after the solder bumps 320 are fused to I/O pads 311 of the semiconductor die 310, the solder bumps 320 are electrically connected to the bonding pads 160 of the substrate 100 in a state that the semiconductor die 310 turns upside down.

Figure 3B:
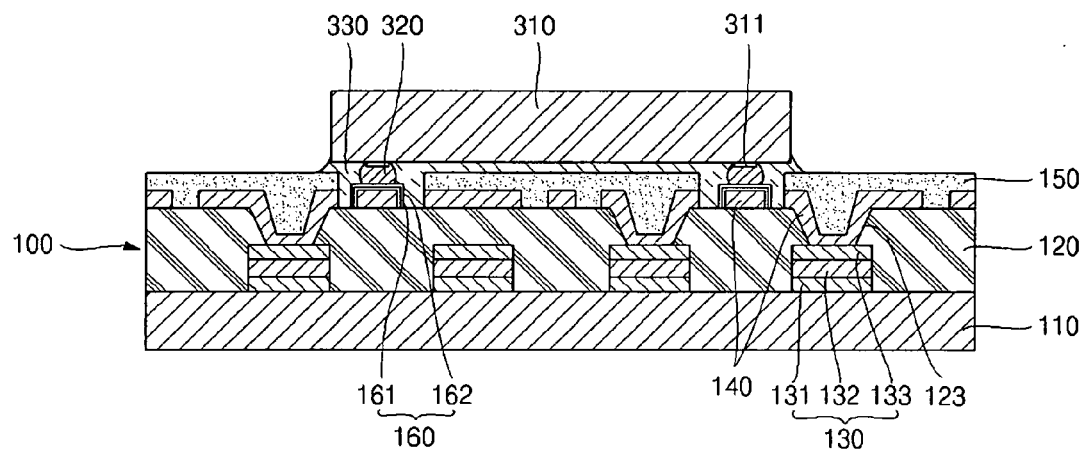

As shown in FIG. 3B, in the underfilling operation, the underfill 330 is injected into the gap between the semiconductor die 310 and the substrate 100. Here, where the underfill 330 is injected into the gap between the semiconductor die 310 and the substrate 100, the gap between the semiconductor die 310 and the substrate 100 completely fills with the underfill 330 through a capillary phenomenon.

Figure 3C:
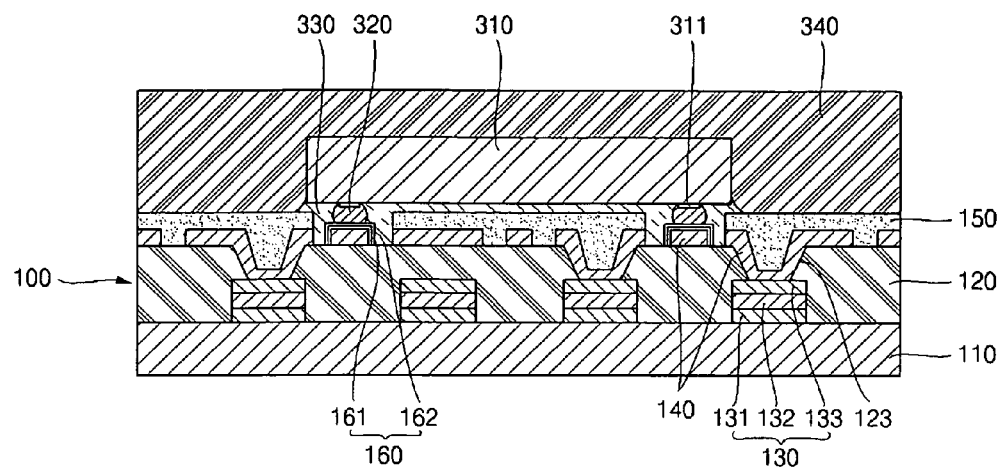

As shown in FIG. 3C, in the encapsulating operation, the peripherals of the semiconductor die 310 and the underfill 330 are encapsulated by the encapsulant 340.

Figure 3D:
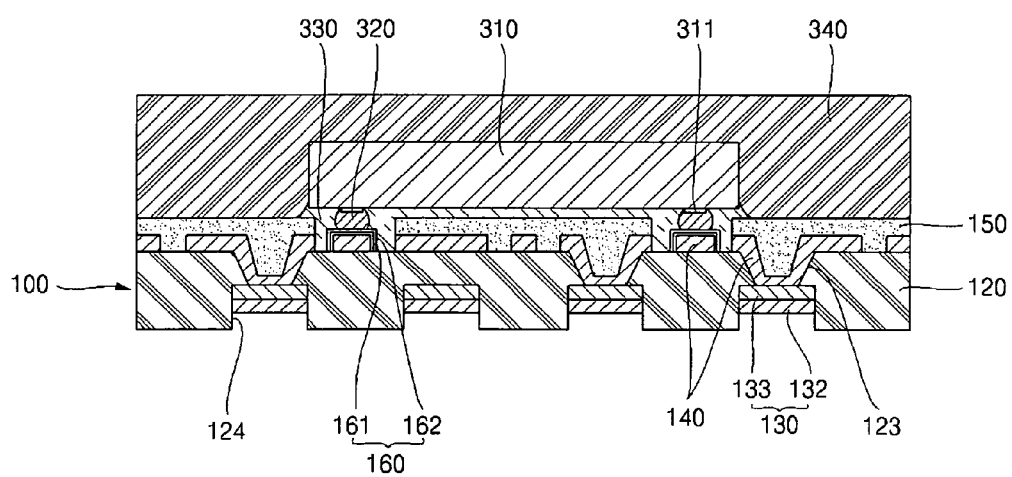

FIG. 3D shows carrier eliminating operation. If the carrier 110 is a metal, then the carrier 110 completely eliminated by the chemical etching process. Accordingly, the bottom surface of the dielectric layer 120 of the substrate 100 is exposed to outside. Also, in the carrier eliminating operation by the chemical etching process, even the copper layer 131 of the conductive lands 130 of the substrate 100 is eliminated, so that the recess 124 of a predetermined depth is naturally formed at the dielectric layer 120 of the substrate 100. At this time, only the gold layer 132 and the copper layer 133 as the conductive land 130 are left over the inside of the recess 124.

However, if the carrier 110 is a film, then the carrier 110 is completely eliminated by the peeling off process (not shown). Accordingly, the bottom surface of the dielectric layer 120 of the substrate 100 is exposed to outside. Also, in the carrier eliminating operation by the peeling off process, the copper layer 131 of the conductive lands 130 of the substrate 100 is exposed to outside, unlike the above embodiment (not shown). That is, the recess 124 is not formed. Therefore, a bottom surface of the dielectric layer 120 may be flushed with a bottom surface of the copper layer 131.

Figure 3E:
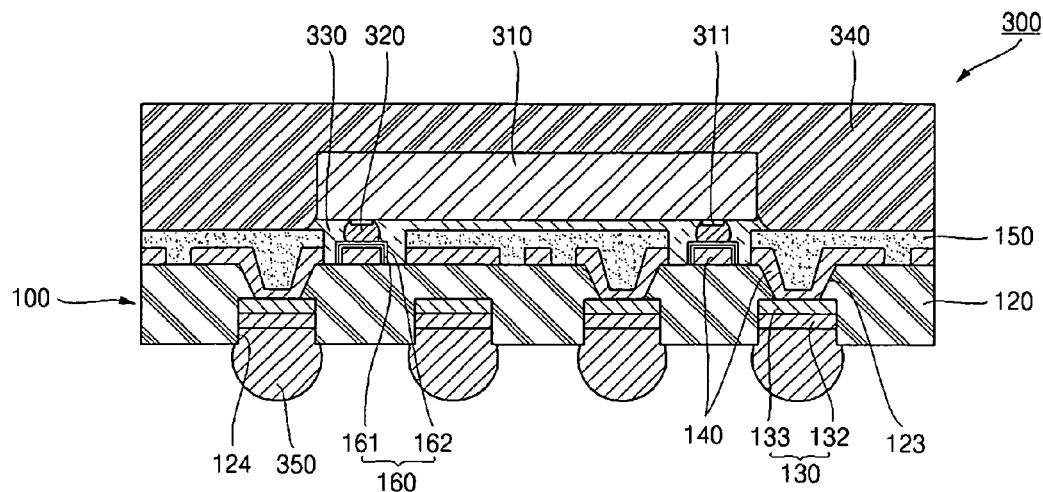

As shown in FIG. 3E, in the solder ball fusing operation, the carrier 110 is eliminated and the plurality of solder balls 350 is fused to the conductive lands 130 exposed to outside through the dielectric layer 120, thereby completing the semiconductor device 300 according to the present invention.

Figure 4:
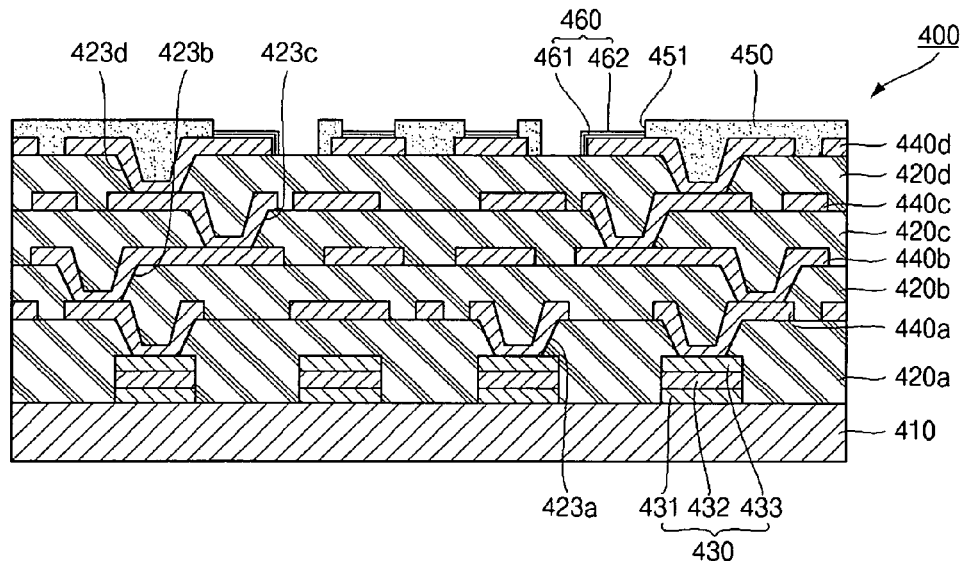
FIG. 4 is a sectional view of a substrate for a semiconductor device according to another embodiment of the present invention.

Referring to FIG. 4, a sectional view of a substrate 400 for a semiconductor device according to another embodiment of the present invention is illustrated.

As shown in FIG. 4, the substrate 400 for semiconductor device includes a carrier 410 having a predetermined stiffness, a first dielectric layer 420a having first electrically conductive patterns 440a and conductive lands 430, a second dielectric layer 420b having second electrically conductive patterns 440b, a third dielectric layer 420c having third electrically conductive patterns 440c, a fourth dielectric layer 420d having fourth electrically conductive patterns 440d and bonding pads 460, and a solder mask 450.

The carrier 410 is in the form of an approximately planar plate. The material of the carrier 410 may be a metal, a ceramics, a glass or its equivalent, in order that the warpage is not generated during the manufacturing process of the semiconductor device. Moreover, in case of the metal as the material of the carrier 410, the material of the carrier 410 may be a copper, an aluminum, a nickel or its equivalent.

The first dielectric layer 420a of a predetermined thickness is formed on the top surface of the carrier 410. The plurality of conductive lands 430 connected to the carrier 410 is formed at the inside of the first dielectric layer 420a. The conductive land 430, that is, a copper layer 431, a gold layer 432, another copper layer 433 may be plated on the carrier 410 in order. Also, the plurality of first electrically conductive patterns 440a is formed at the top surface of the first dielectric layer 420a and is electrically connected to the conductive lands 430 through via holes 423a formed at the first dielectric layer 420a.

The second dielectric layer 420b of a predetermined thickness is formed on the top surface of the first dielectric layer 420a. Also, the plurality of second electrically conductive patterns 440b is formed at the top surface of the second dielectric layer 420b and is electrically connected to the first electrically conductive patterns 440a through via holes 423b formed at the second dielectric layer 420b.

The third dielectric layer 420c of a predetermined thickness is formed on the top surface of the second dielectric layer 420b. Also, the plurality of third electrically conductive patterns 440c is formed at the top surface of the third dielectric layer 420c and is electrically connected to the second electrically conductive patterns 440b through via holes 423c formed at the third dielectric layer 420c.

The fourth dielectric layer 420d of a predetermined thickness is formed on the top surface of the third dielectric layer 420c. Also, the plurality of fourth electrically conductive patterns 440d is formed at the top surface of the fourth dielectric layer 420d and is electrically connected to the third electrically conductive patterns 440c through via holes 423d formed at the fourth dielectric layer 420d. Moreover, the bonding pads 460 including a nickel layer 461 and the gold layer 462 may be plated on predetermined regions of the fourth electrically conductive pattern 440d formed at the fourth dielectric layer 420d.

Meanwhile, in the illustrated case, the dielectric layer has only four layers. However, the present invention is not limited to the dielectric layer having only four layers. In accordance with the present invention, the dielectric layer may have three, four or more dielectric layer.

The solder mask 450 is formed on the top surface of the fourth dielectric layer 420d in order to cover the fourth electrically conductive patterns 440d. Accordingly, the solder mask 450 serves to protect the fourth electrically conductive patterns 440d from the external impact. However, the solder mask 450 does not cover the bonding pads 460. That is, the bonding pads 460 are exposed to outside through the openings 451.

Referring to FIG. 4A through FIG. 4F, sectional views showing a fabrication method of the semiconductor device according to another embodiment of the present invention is illustrated.

As shown in the drawings, the fabrication method of the semiconductor device includes a multi layer forming operation, a solder mask printing operation, a solder mask exposing/developing operation, a photo sensitive film providing operation, a plating operation, and a photo sensitive film eliminating operation.

Figure 4A:
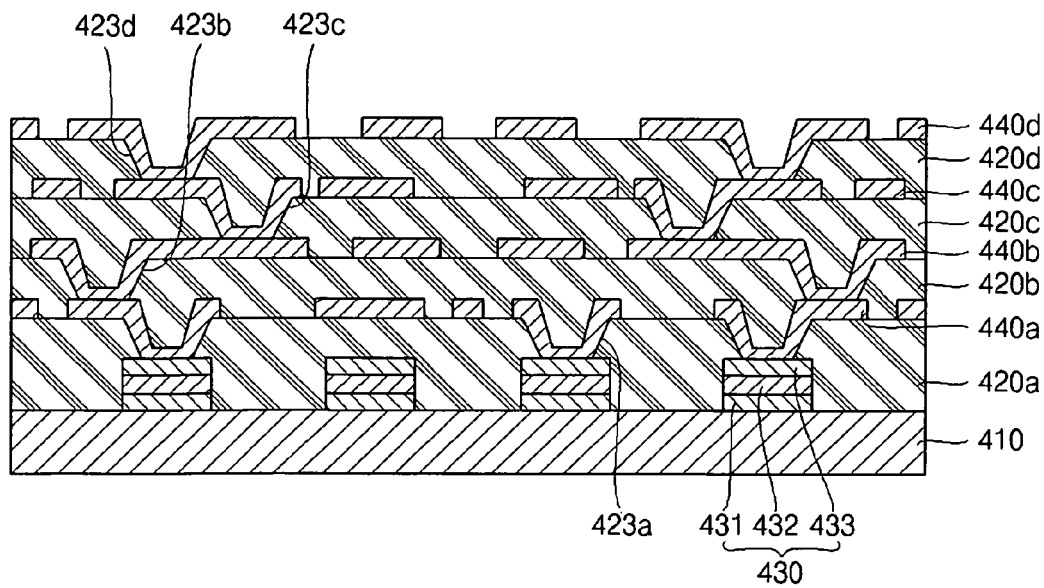
FIG. 4A through FIG. 4F is a flow chart showing a fabrication method of a semiconductor device according to another embodiment of the present invention.

As shown in FIG. 4A, in the multi layer forming operation, the first dielectric layer 420a having the first electrically conductive patterns 440a and conductive lands 430, the second dielectric layer 420b having the second electrically conductive patterns 440b, the third dielectric layer 420c having the third electrically conductive patterns 440c, and the fourth dielectric layer 420d having the fourth electrically conductive patterns 440d are laminated on the carrier 410 in order. Here, the number of the layer may be less than 4 or more than 5. However, the present invention is not limited to the number of the layer.

Figure 4B:
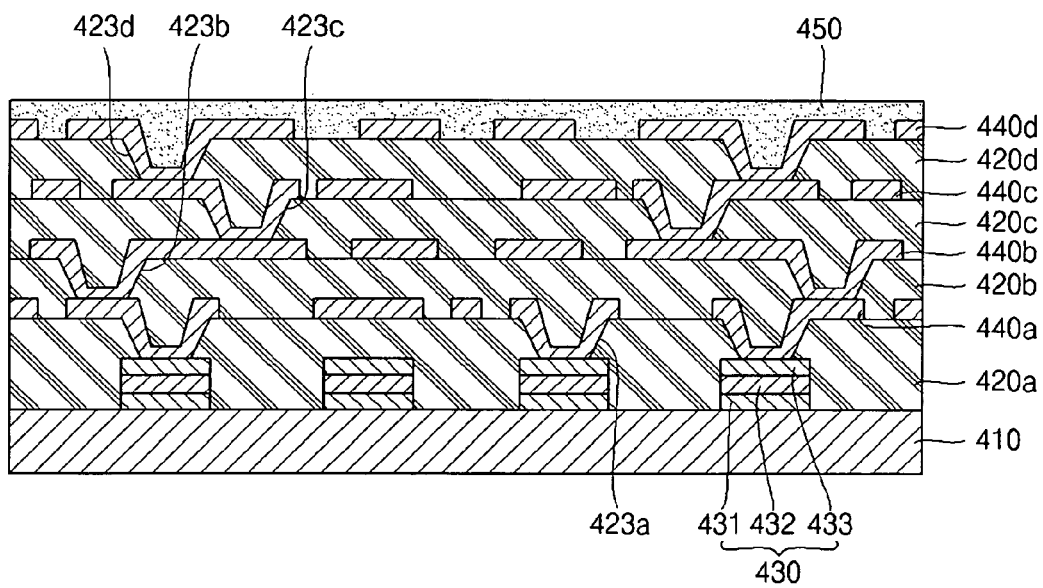

As shown in FIG. 4B, in the solder mask printing operation, the solder mask 450 of a predetermined thickness is printed on the fourth dielectric layer 420d in order to cover the fourth electrically conductive patterns 440d formed at the surface of the fourth dielectric layer 420d. The material of the solder mask 450 may be photosensitivity or insensitivity. The solder mask 450 serves to prevent the oxidation of the fourth electrically conductive patterns 440d and its damage from the external impact during the manufacturing process of the semiconductor device.

Figure 4C:
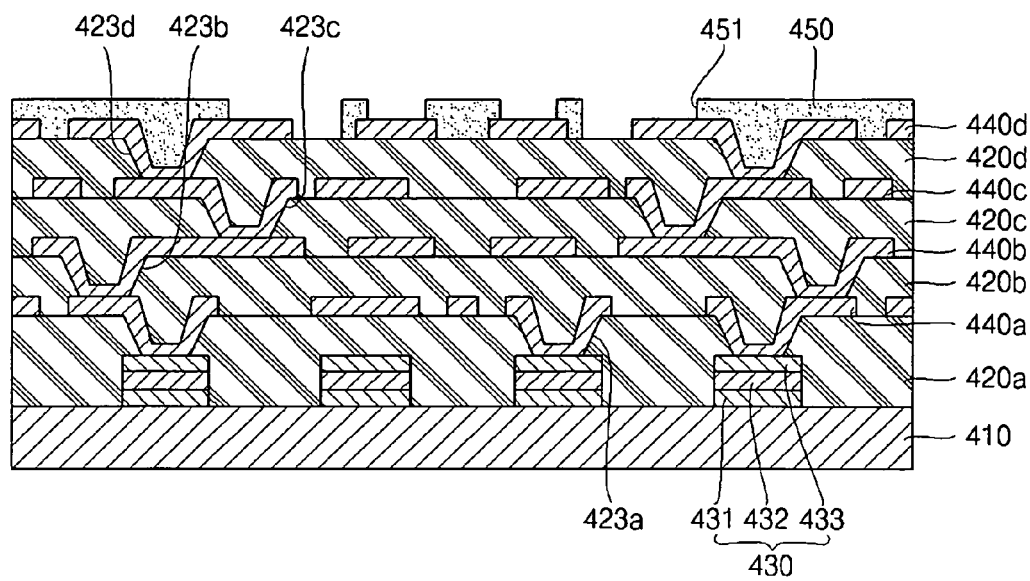

As shown in FIG. 4C, in the solder mask exposing/developing operation, a predetermined region of the solder mask 450 is eliminated by the exposing/developing process. That is, the plurality of openings 451 is formed at the solder mask 450, so that a predetermined area of each fourth electrically conductive pattern 440d is exposed to outside.

Figure 4D:
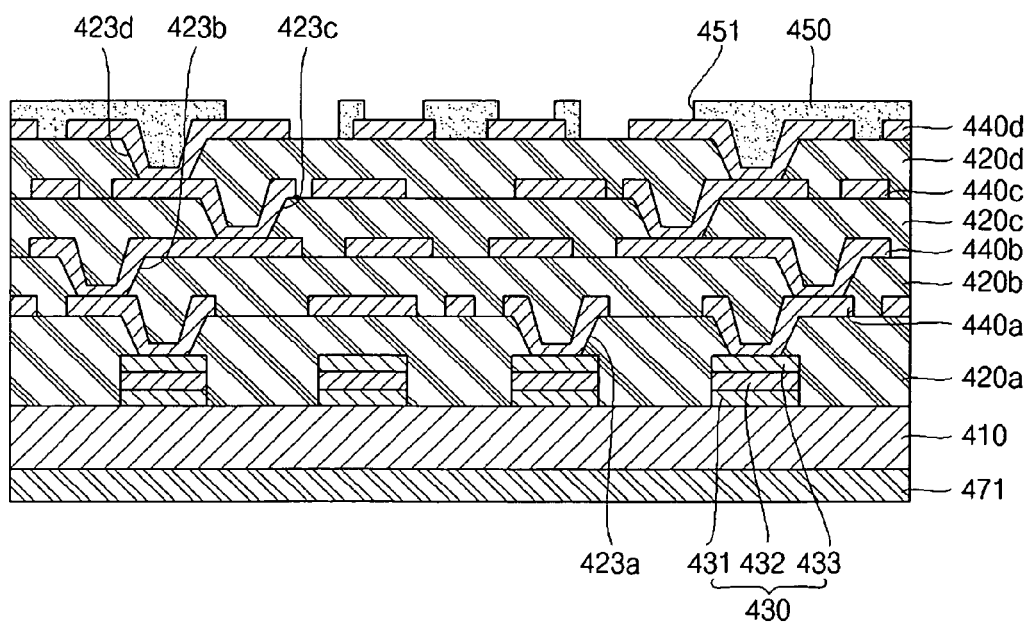

As shown in FIG. 4D, in the photo sensitive film providing operation, the photo sensitive film 471 of a predetermined thickness is formed at the bottom surface of the carrier 410. Here, since the photo sensitive film 471 serves to prevent the plating layer from being formed at the bottom surface of the carrier 410 during the plating process, the material of the photo sensitive film 471 may not be photosensitivity.

Figure 4E:
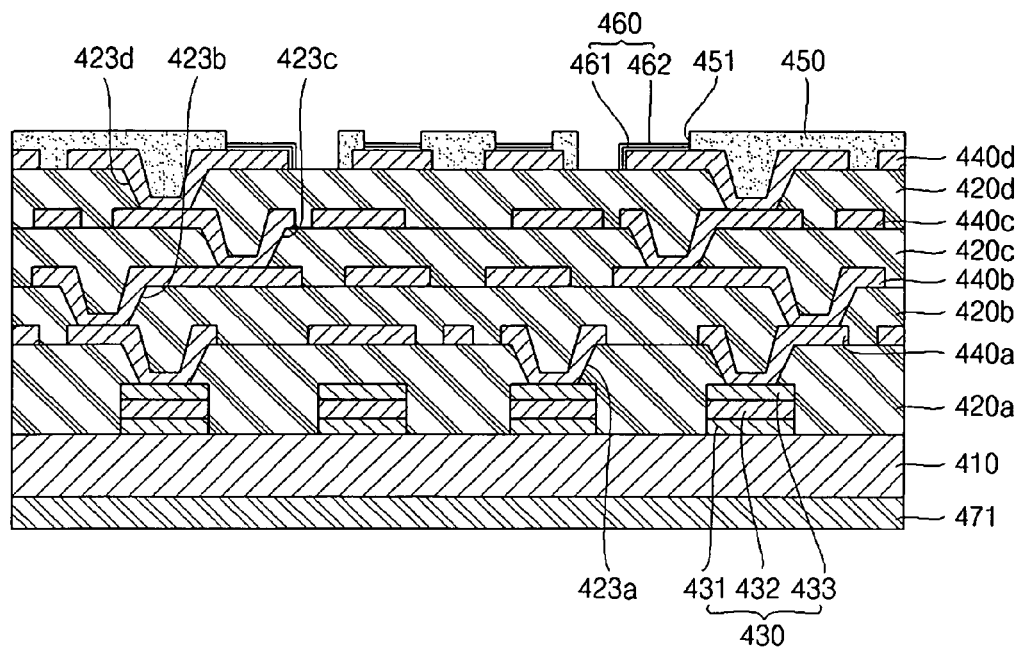

As shown in FIG. 4E, in the plating operation, the plurality of bonding pads 460 is formed at predetermined regions of the fourth electrically conductive patterns 440d exposed to outside through the solder mask 450. The plurality of bonding pads 460 can be formed by means of the electrolytic plating process. That is, the nickel layer 461 and the gold layer 462 may be plated on the fourth electrically conductive pattern 440d of a predetermined region exposed to outside through the opening 451 of the solder mask 450, thereby forming the bonding pad 460 of a predetermined thickness. The bonding pad 460 serves to electrically connect with the semiconductor die 310 during manufacturing process of the semiconductor device.

Figure 4F:
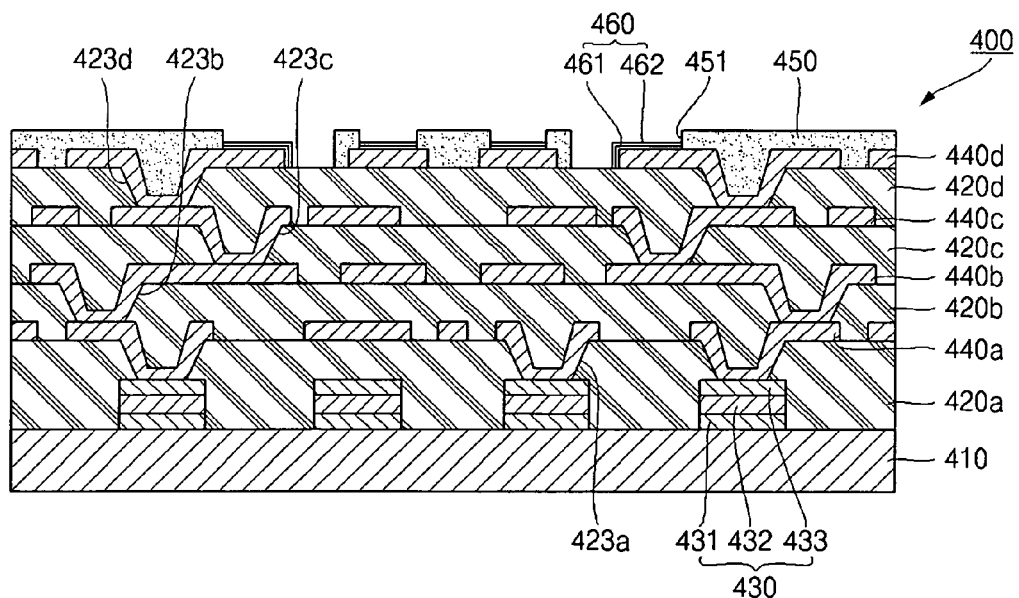

As shown in FIG. 4F, in the photo sensitive film eliminating operation, the photo sensitive film 471 formed on the bottom surface of the carrier 410 is eliminated by a chemical etching and the like thereby completing the substrate 400 according to the present invention. Here, the bottom surface of the carrier 410 is exposed to outside through the photo sensitive film elimination process.

Figure 5:
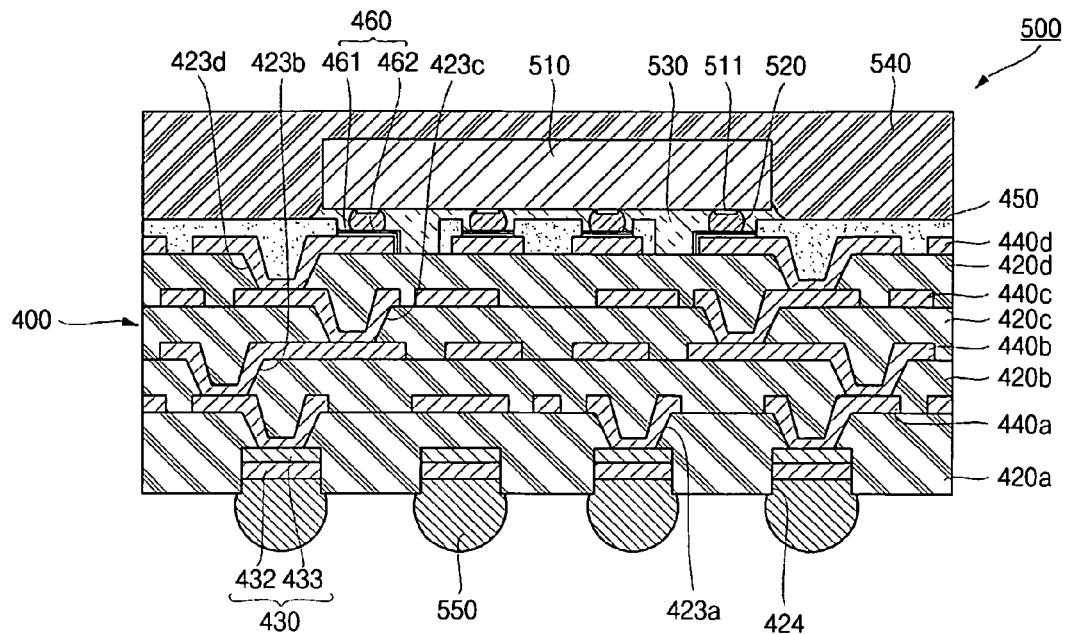
FIG. 5 is a sectional view of a semiconductor device according to another embodiment of the present invention.

Referring to FIG. 5, a sectional view of a semiconductor device 500 according to another embodiment of the present invention is illustrated.

As shown in FIG. 5, a semiconductor die 510 can be connected to the above substrate 400 in the form of a flip chip. That is, I/O pads 511 of the semiconductor die 510 are electrically connected to the bonding pads 460 formed at the fourth dielectric layer 420d of the substrate 400 by means of solder bumps 520. Here, an underfill 530 is filling between the semiconductor die 510 and the fourth dielectric layer 420d. Also, the underfill 530 covers the solder bumps 520, the solder mask 450, the bonding pads 460 and the fourth dielectric layer 420d corresponding to the lower portion of the semiconductor die 510.

In the meantime, the peripheral of the semiconductor die 510 and the underfill 530 are encapsulated by an encapsulant 540. Here, the encapsulant 540 covers the solder mask 450 formed at the fourth dielectric layer 420d.

In the illustrated case, the semiconductor die 510 is connected to the substrate 400 in the form of the flip chip. However, the semiconductor die 510 can be connected to the substrate 400 by means of a wire bonding method.

Also, a plurality of solder balls 550 is fused to the substrate 400, that is, the conductive lands 430 formed at the first dielectric layer 420a. Here, The solder ball 550 serves to mechanically and electrically connect the semiconductor device 500 to the external device. Also, each conductive land 430 includes a gold layer 432 and only one copper layer 433.

Referring to FIG. 5A through FIG. 5E, sectional views showing a fabrication method of the semiconductor device 500 according to another embodiment of the present invention is illustrated.

As shown in the drawings, the fabrication method of the semiconductor device 500 includes a substrate providing operation/a flip chip bonding operation, an underfilling operation, an encapsulating operation, a carrier eliminating operation and a solder ball fusing operation.

Figure 5A:
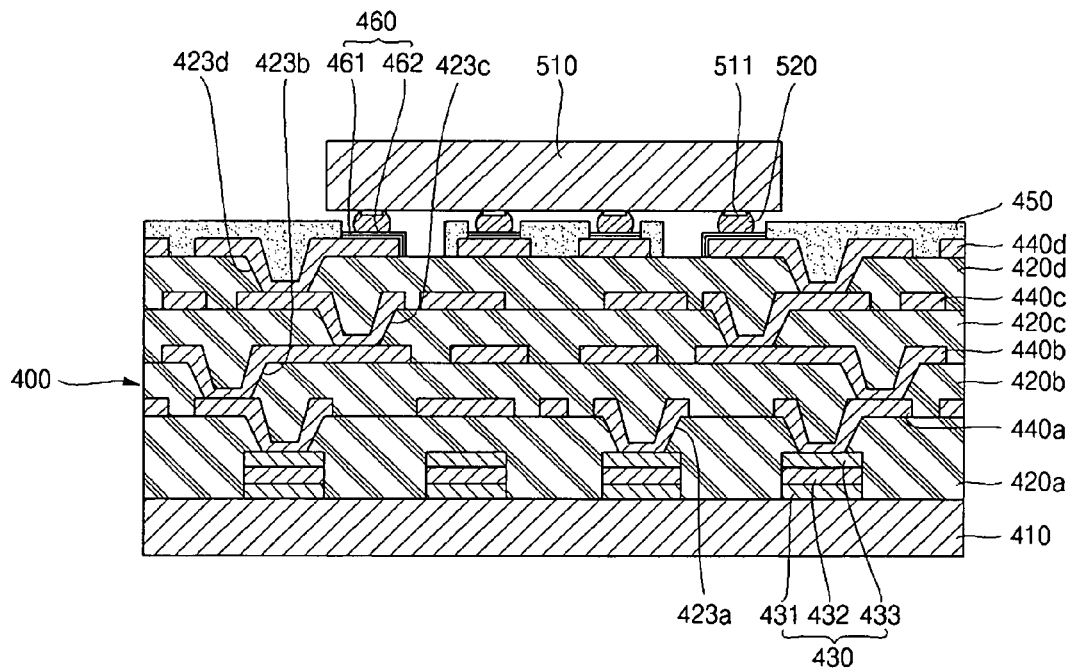
FIG. 5A through FIG. 5E are sectional views showing a fabrication method of a semiconductor device according to another embodiment of the present invention where.

As shown in FIG. 5A, in the substrate providing operation/the flip chip bonding operation, the substrate 400 of the multi layer having the carrier 410 at bottom surface thereof is provided. Thereafter, the semiconductor die 510 is bonded on the top surface of the substrate 400 in the form of the flip chip. That is, That is, after the solder bumps 520 are fused to the I/O pads 511 of the semiconductor die 510, the solder bumps 520 are electrically connected to the bonding pads 460 of the substrate 400 in a state that the semiconductor die 510 turns upside down.

Figure 5B:
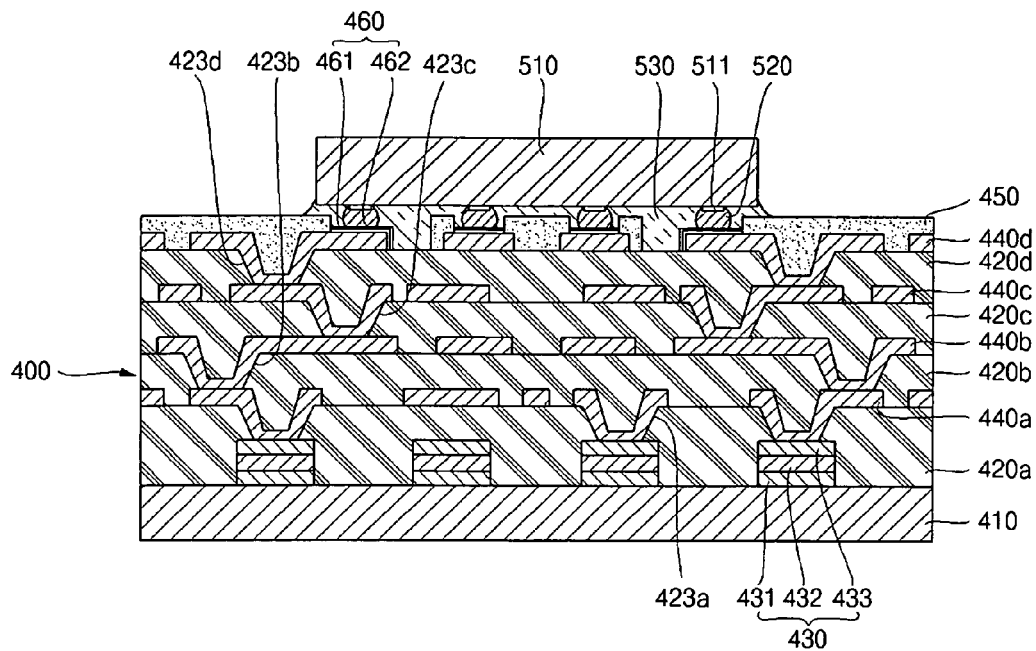

As shown in FIG. 5B, in the underfilling operation, the underfill 530 is injected into the gap between the semiconductor die 510 and the substrate 400. Here, where the underfill 530 is injected into the gap between the semiconductor die 510 and the substrate 400. The gap between the semiconductor die 510 and the substrate 400 completely fills with the underfill 530 through a capillary phenomenon.

Figure 5C:
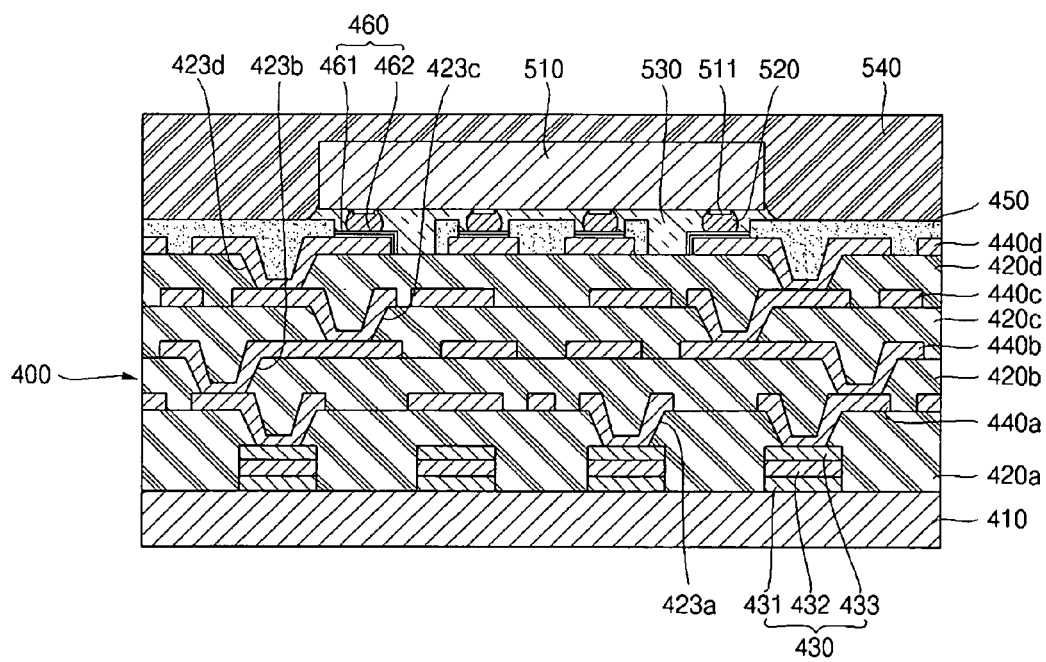

As shown in FIG. 5C, in the encapsulating operation, the peripherals of the semiconductor die 510 and the underfill 530 are encapsulated by the encapsulant 540. Also, the encapsulant 540 covers the solder mask 450 of the substrate 400.

Figure 5D:
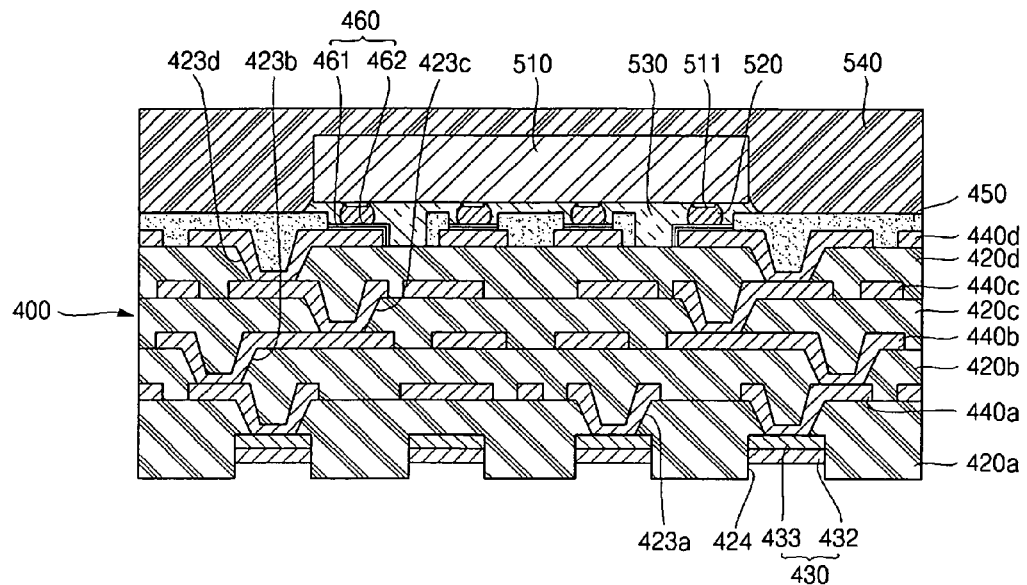

FIG. 5D shows carrier eliminating operation. If the carrier 410 is a metal, then the carrier 410 completely eliminated by the chemical etching process. Accordingly, the bottom surface of the dielectric layer 420a of the substrate 400 is exposed to outside. Also, in the carrier eliminating operation by the chemical etching process, even the copper layer 431 of the conductive lands 430 of the substrate 400 is eliminated, so that the recess 424 of a predetermined depth is naturally formed at the dielectric layer 420a of the substrate 400. At this time, only the gold layer 432 and the copper layer 433 as the conductive land 430 are left over the inside of the recess 424.

However, if the carrier 410 is a film, then the carrier 410 is completely eliminated by the peeling off process (not shown). Accordingly, the bottom surface of the dielectric layer 420a of the substrate 400 is exposed to outside. Also, in the carrier eliminating operation by the peeling off process, the copper layer 431 of the conductive lands 430 of the substrate 400 is exposed to outside, unlike the above embodiment (not shown). That is, the recess 424 is not formed. Therefore, a bottom surface of the dielectric layer 420a may be flushed with a bottom surface of the copper layer 431.

Figure 5E:
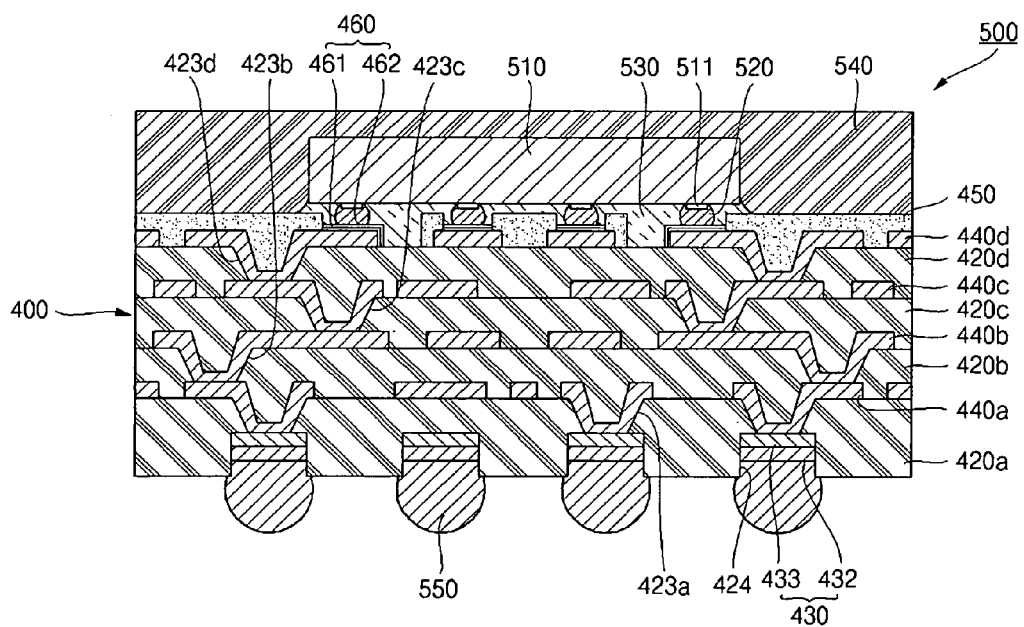

As shown in FIG. 5E, in the solder ball fusing operation, the carrier 410 is eliminated and the plurality of solder balls 550 is fused to the conductive lands 430 exposed to outside through the first dielectric layer 420a, thereby completing the semiconductor device 500 according to the present invention.

In the meantime, the semiconductor device 500 may be manufactured by another method.

That is, referring to FIG. 6A through FIG. 6E, sectional views showing another fabrication method of the semiconductor device 500 according to the present invention is illustrated.

As shown in the drawings, the fabrication method of the semiconductor device 500 includes a carrier eliminating operation, a flip chip bonding operation, an underfilling operation, an encapsulating operation, and a solder ball fusing operation.

Figure 6A:
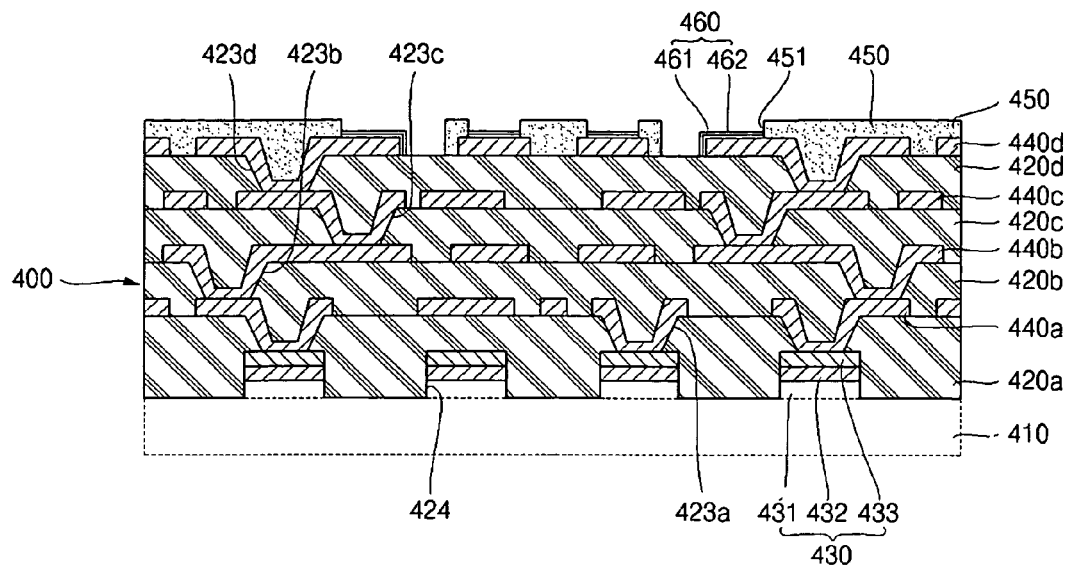
FIG. 6A through FIG. 6E are sectional views showing a fabrication method of a semiconductor device according to another embodiment of the present invention where.

FIG. 6A shows carrier eliminating operation. If the carrier 410 is a metal, then the carrier 410 completely eliminated by the chemical etching process. Accordingly, the bottom surface of the dielectric layer 420a of the substrate 400 is exposed to outside. Also, in the carrier eliminating operation by the chemical etching process, even the copper layer 431 of the conductive lands 430 of the substrate 400 is eliminated, so that the recess 424 of a predetermined depth is naturally formed at the dielectric layer 420a of the substrate 400. At this time, only the gold layer 432 and the copper layer 433 as the conductive land 430 are left over the inside of the recess 424.

However, if the carrier 410 is a film, then the carrier 410 is completely eliminated by the peeling off process (not shown). Accordingly, the bottom surface of the dielectric layer 420a of the substrate 400 is exposed to outside. Also, in the carrier eliminating operation by the peeling off process, the copper layer 431 of the conductive lands 430 of the substrate 400 is exposed to outside, unlike the above embodiment (not shown). That is, the recess 424 is not formed. Therefore, a bottom surface of the dielectric layer 420a may be flushed with a bottom surface of the copper layer 431.

Figure 6B:
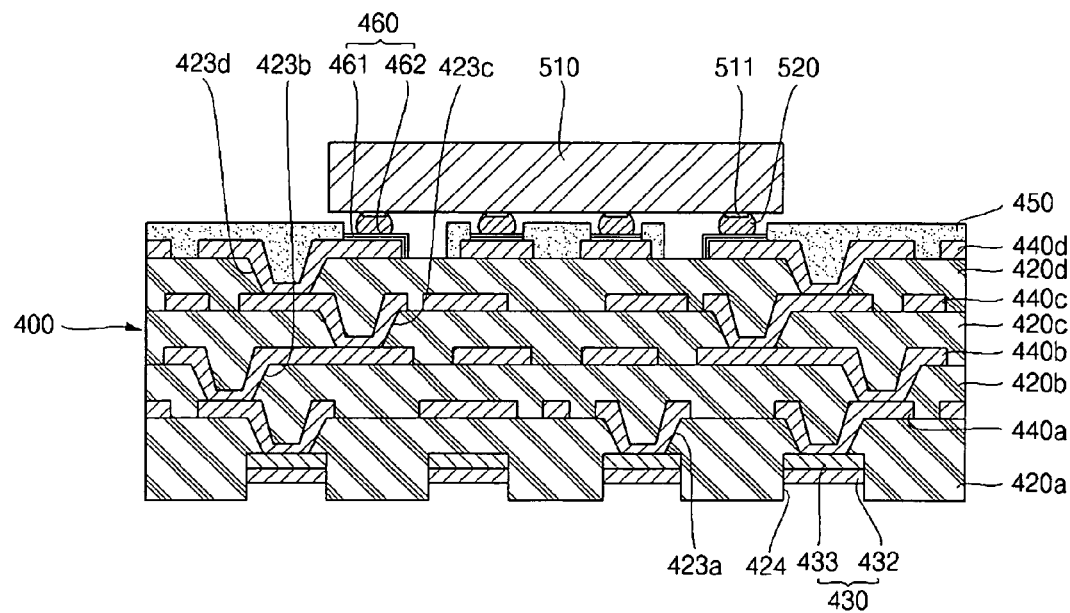

As shown in FIG. 6B, in the flip chip bonding operation, the substrate, the semiconductor die 510 is bonded on the top surface of the substrate 400 in the form of the flip chip. That is, That is, after the solder bumps 520 are fused to the I/O pads 511 of the semiconductor die 510, the solder bumps 520 are electrically connected to the bonding pads 460 of the substrate 400 in a state that the semiconductor die 510 turns upside down.

Figure 6C:
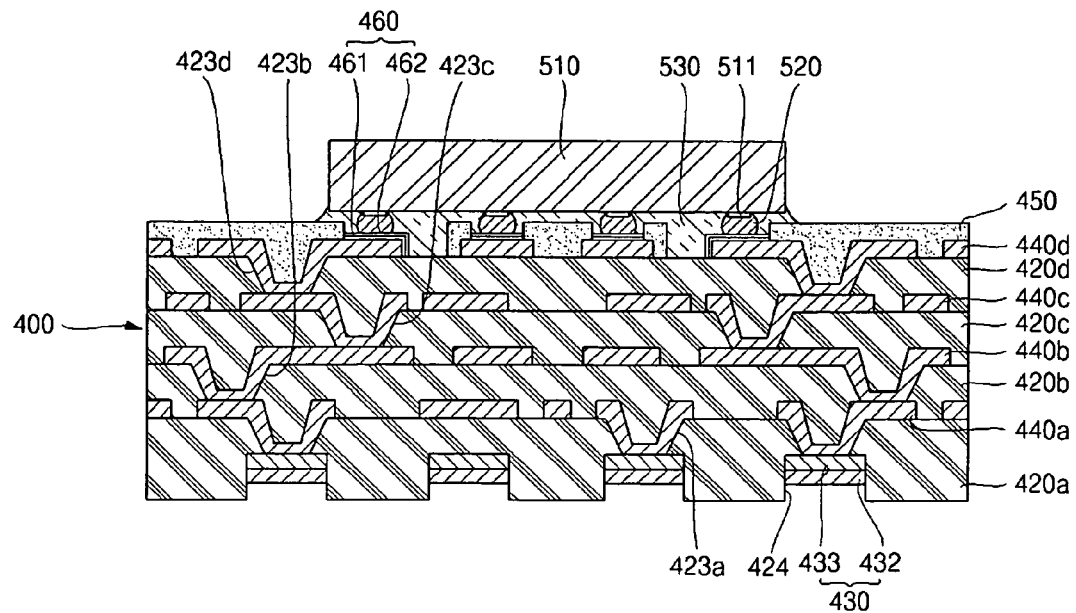

As shown in FIG. 6C, in the underfilling operation, the underfill 530 is injected into the gap between the semiconductor die 510 and the substrate 400. Here, where the underfill 530 is injected into the gap between the semiconductor die 510 and the substrate 400, the gap between the semiconductor die 510 and the substrate 400 completely fills with the underfill 530 through a capillary phenomenon.

Figure 6D:
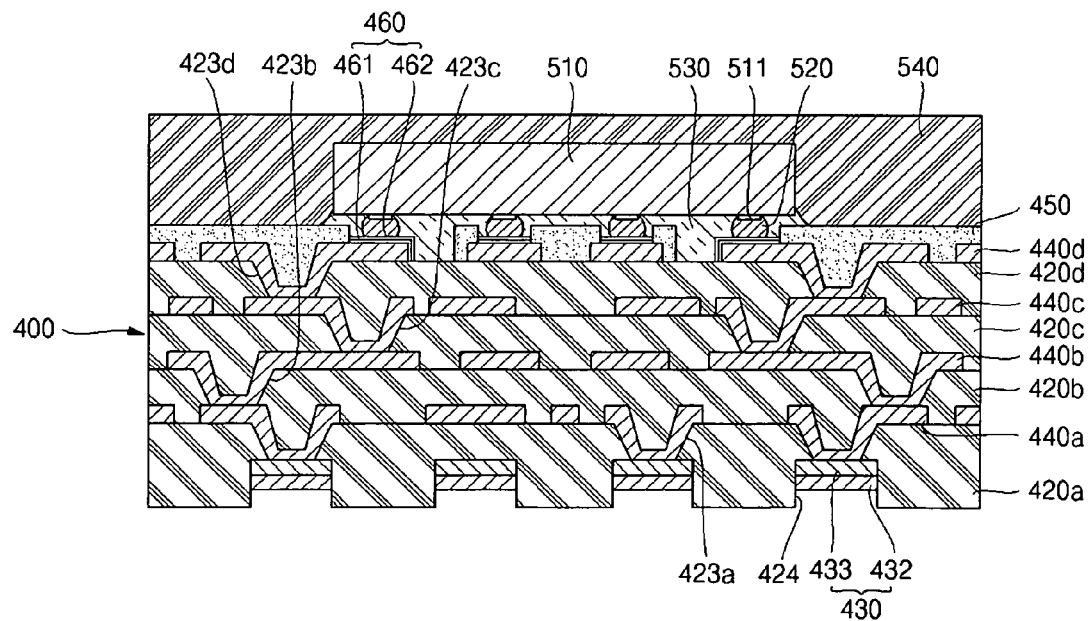

As shown in FIG. 6D, in the encapsulating operation, the peripherals of the semiconductor die 510 and the underfill 530 are encapsulated by the encapsulant 540. Also, the encapsulant 540 covers the solder mask 450 of the substrate 400.

Figure 6E:
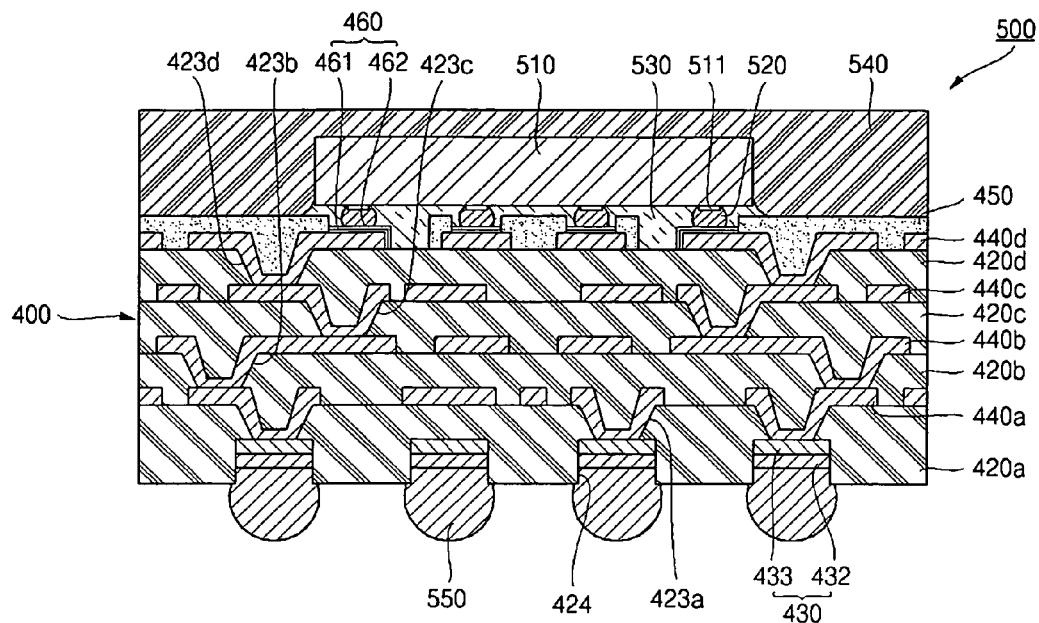

As shown in FIG. 6E, in the solder ball fusing operation, the plurality of solder balls 550 is fused to the conductive lands 430 exposed to outside through the first dielectric layer 420a, thereby completing the semiconductor device 500 according to the present invention.

In the meantime, the semiconductor device 500 may be manufactured by another method. In other words, dissimilarly with the above methods, the semiconductor die 510 can be bonded on the bottom surface of the substrate 400 in the form of the flip chip and the plurality of solder balls 550 can be the top surface of the substrate 400.

That is, referring to FIG. 7A through FIG. 7E, sectional views showing fabrication method of another semiconductor device 500' according to the present invention is illustrated.

As shown in the drawings, the fabrication method of the semiconductor device 500' includes a carrier eliminating operation, a flip chip bonding operation, an underfilling operation, an encapsulating operation, and a solder ball fusing operation.

Figure 7A:
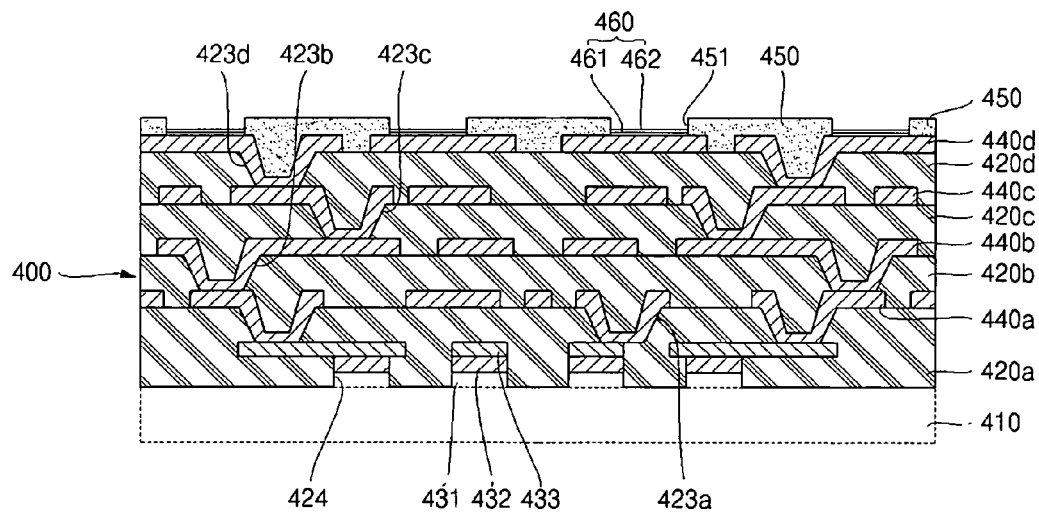
FIG. 7A through FIG. 7E are sectional views showing a fabrication method of a semiconductor device according to another embodiment of the present invention where.

FIG. 7A shows carrier eliminating operation. If the carrier 410 is a metal, then the carrier 410 is completely eliminated by the chemical etching process. Accordingly, the bottom surface of the dielectric layer 420a of the substrate 400 is exposed to outside. Also, in the carrier eliminating operation by the chemical etching process, even the copper layer 431 of the conductive lands 430 of the substrate 400 is eliminated, so that the recess 424 of a predetermined depth is naturally formed at the dielectric layer 420a of the substrate 400. At this time, only the gold layer 432 and the copper layer 433 as the conductive land 430 are left over the inside of the recess 424.

However, if the carrier 410 is a film, then the carrier 410 is completely eliminated by the peeling off process (not shown). Accordingly, the bottom surface of the dielectric layer 420a of the substrate 400 is exposed to outside. Also, in the carrier eliminating operation by the peeling off process, the copper layer 431 of the conductive lands 430 of the substrate 400 is exposed to outside, unlike the above embodiment (not shown). That is, the recess 424 is not formed. Therefore, a bottom surface of the dielectric layer 420a may be flushed with a bottom surface of the copper layer 431.

Figure 7B:
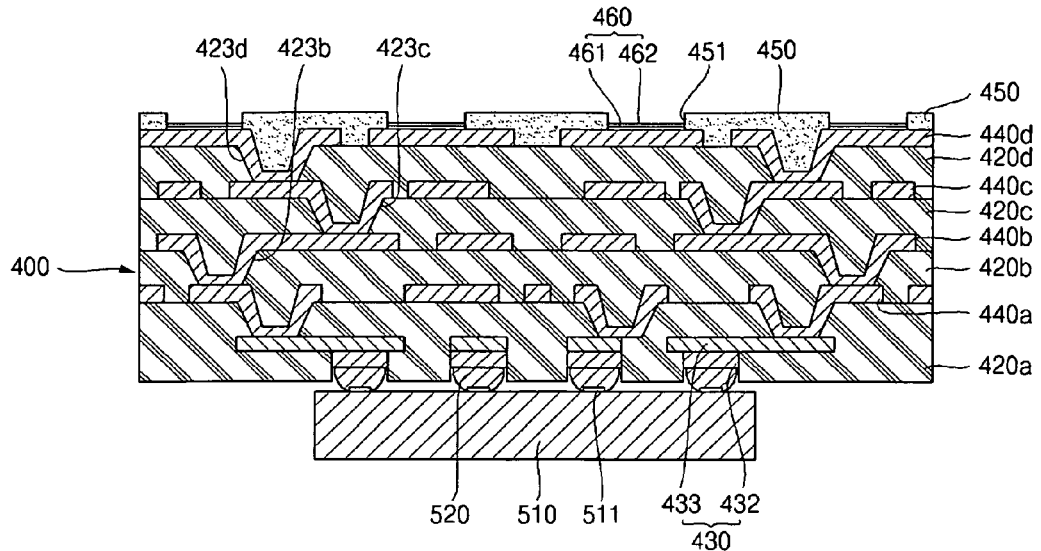

As shown in FIG. 7B, in the flip chip bonding operation, the substrate, the semiconductor die 510 is bonded on the conductive lands 430, that is, the gold layer 432 exposed to outside through the recesses 424 in the form of the flip chip. That is, after the solder bumps 520 are fused to the I/O pads 511 of the semiconductor die 510, the solder bumps 520 are electrically connected to the conductive lands 430 of the substrate 400.

Figure 7C:
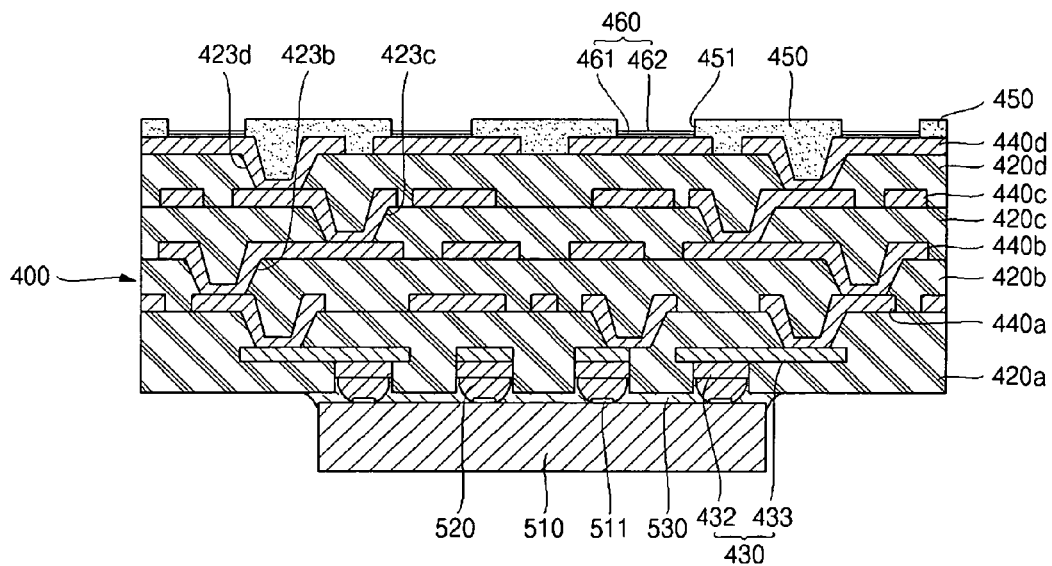

As shown in FIG. 7C, in the underfilling operation, the underfill 530 is injected into the gap between the semiconductor die 510 and the substrate 400. Here, where the underfill 530 is injected into the gap between the semiconductor die 510 and the first dielectric layer 420a corresponding to the semiconductor die 510, the gap between the semiconductor die 510 and the first dielectric layer 420a completely fills with the underfill 530 through a capillary phenomenon. Here, the underfill 530 completely covers the solder bumps 520, thereby preventing the oxidation of the solder bump 520.

Figure 7D:
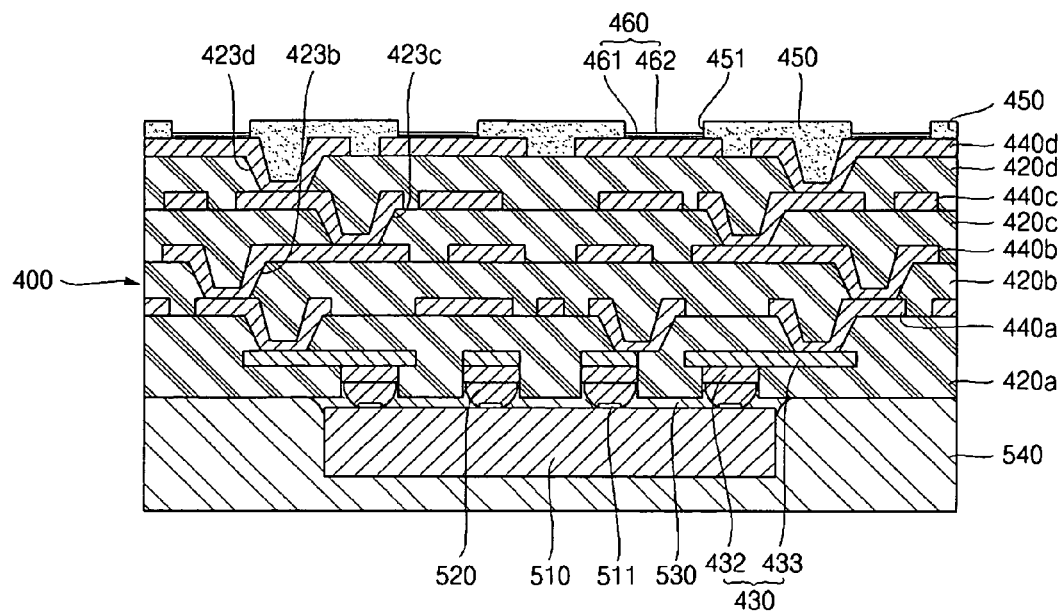

As shown in FIG. 7D, in the encapsulating operation, the semiconductor die 510 and the underfill 530 are encapsulated by the encapsulant 540. Also, the encapsulant 540 covers the bottom surface of the first dielectric layer 420a, not the solder mask.

Figure 7E:
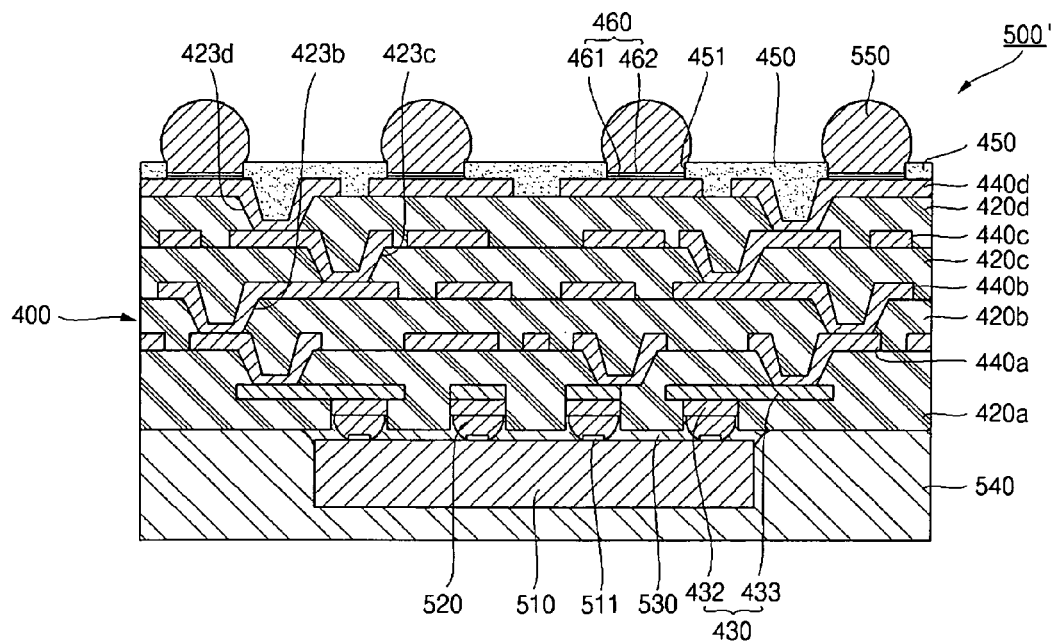

As shown in FIG. 7E, in the solder ball fusing operation, the plurality of solder balls 550 is fused to the bonding pads 460, not the conductive lands 430. That is, the plurality of solder balls 550, not the semiconductor die 510 is fused to the bonding pads 460 exposed to outside through the openings 451 of the solder mask 450 and formed at the fourth dielectric layer 420d. Here, after a flux is applied on the bonding pads 460d, the solder balls are temporarily attached on the bonding pads 460d and then, the solder balls are thoroughly fixed to the bonding pads 460d by means of a reflow process of a high temperature, thereby completing the semiconductor device 500'.

This disclosure provides exemplary embodiments of the present invention. The scope of the present invention is not limited by these exemplary embodiments. Numerous variations, whether explicitly provided for or implied by the specification, such as variations in structure, dimension and type of material and the manufacturing process may be implemented by one who is skilled in the art, in view of this disclosure.

What is claimed is:

1. A substrate for a semiconductor package comprising:
  a dielectric layer having a first surface and a second surface opposed to the first surface;
  a plurality of conductive lands having a surface substantially coplanar with the first surface of the dielectric layer at an inside of the dielectric layer, wherein the conductive lands comprise a copper layer, a gold layer, another copper layer in order;
  a metal carrier of an approximately planar plate bonded at the first surface of the dielectric layer and connected to the conductive lands;
  a plurality of electrically conductive patterns electrically connected to the conductive lands at the second surface of the dielectric layer; and
  a solder mask covering the dielectric layer and the electrically conductive patterns and having a plurality of openings, a predetermined area of each conductive pattern being exposed to outside through the openings.

2. The substrate for a semiconductor package as claimed in claim 1, wherein a plurality of via holes of a predetermined depth is further formed at the second surface of the dielectric layer facing the first surface thereof and the electrically conductive patterns are electrically connected to the conductive lands through the via holes.

3. The substrate for a semiconductor package as claimed in claim 1, wherein a plurality of bonding pads is formed at the electrically conductive patterns exposed to outside through the openings of the solder mask.

4. The substrate for a semiconductor package as claimed in claim 3, wherein each bonding pad comprises a nickel layer and a gold layer in order.

5. The substrate for a semiconductor package as claimed in claim 1, wherein the dielectric layer has a plurality of layers stacked up on one another and each layers has the electrically conductive patterns.

6. A semiconductor package comprising:
  a substrate comprising a single layer dielectric layer, a plurality of conductive lands formed inside of the dielectric layer at a bottom surface of the dielectric layer, wherein the dielectric layer comprises a plurality of recesses at the bottom surface of the dielectric layer, the conductive lands being formed inside of the recesses, and a plurality of electrically conductive patterns formed at a top surface of the dielectric layer and connected to the plurality of conductive lands, wherein a plurality of bonding pads is formed at the electrically conductive patterns;
  a solder mask covering the dielectric layer and the electrically conductive patterns and having a plurality of openings, the bonding pads being located within the openings and being spaced apart from the solder mask so that portions of the top surface of the dielectric layer around the bonding pads are exposed through the openings;
  a semiconductor die attached to a top surface of the substrate and connected to the electrically conductive patterns;
  an encapsulant for encapsulating the top surface of the substrate and the semiconductor die; and
  a plurality of solder balls fused to the conductive lands of the substrate, wherein each solder ball of the plurality of solder balls extends into only a single respective recess of the plurality of recesses, wherein the conductive lands comprise:
  a copper layer; and
  a gold layer on the copper layer, the solder balls being fused to the gold layer.

7. The semiconductor package as claimed in claim 6, wherein the semiconductor die is connected to the electrically conductive patterns by conductive connecting means selected from the group consisting of conductive wires and solder bumps.

8. A substrate for a semiconductor package, comprising:
  a metal carrier of a planar plate;
  a plurality of conductive lands on a surface of the carrier, wherein the conductive lands comprise a copper layer, a gold layer, another copper layer in order;
  a dielectric layer on the surface of the carrier covering the conductive lands;
  a plurality of electrically conductive patterns on a surface of the dielectric layer electrically connected to the conductive lands; and
  a solder mask on surfaces of the dielectric layer and the electrically conductive patterns, a predetermined area of each conductive pattern being exposed to outside through openings of the solder mask.

9. The substrate for a semiconductor package as claimed in claim 8, wherein the dielectric layer comprises a first surface and a second surface opposed to the first surface, the first surface of the dielectric layer being bonded to the surface of the carrier.

10. The substrate for a semiconductor package as claimed in claim 9, wherein a plurality of via holes of a predetermined depth is further formed at the second surface of the dielectric layer facing the first surface thereof and the electrically conductive patterns are electrically connected to the conductive lands through the via holes.

11. The substrate for a semiconductor package as claimed in claim 8, wherein a plurality of bonding pads is formed at the electrically conductive patterns exposed to outside through the openings of the solder mask.

12. The substrate for a semiconductor package as claimed in claim 11, wherein each bonding pad comprises a nickel layer and a gold layer in order.

13. The substrate for a semiconductor package as claimed in claim 1, wherein the carrier comprises copper.

14. The substrate for a semiconductor package as claimed in claim 8, wherein the carrier comprises copper.

15. A semiconductor package comprising:
  a substrate comprising a single layer dielectric layer, a plurality of conductive lands formed inside of the dielectric layer at a bottom surface of the dielectric layer, wherein the dielectric layer comprises a plurality of recesses at the bottom surface of the dielectric layer, the conductive lands being formed inside of the recesses, and a plurality of electrically conductive patterns formed at a top surface of the dielectric layer and connected to the plurality of conductive lands, wherein a plurality of bonding pads is formed at the electrically conductive patterns;
  a solder mask covering the dielectric layer and the electrically conductive patterns and having a plurality of openings, the bonding pads being located within the openings and being spaced apart from the solder mask so that portions of the top surface of the dielectric layer around the bonding pads are exposed through the openings;

a semiconductor die attached to a top surface of the substrate and connected to the electrically conductive patterns, wherein the semiconductor die is connected to top surfaces of the bonding pads by conductive wires;

an encapsulant for encapsulating the top surface of the substrate and the semiconductor die, wherein the encapsulant encapsulates the conductive wires, the top and side surfaces of the bonding pads, and the portions of the top surface of the dielectric layer around the bonding pads exposed through the openings; and a plurality of solder balls fused to the conductive lands of the substrate, wherein each solder ball of the plurality of solder balls extends into only a single respective recess of the plurality of recesses.

* * * * *

UNITED STATES PATENT AND TRADEMARK OFFICE
CERTIFICATE OF CORRECTION

| | | |
|---|---|---|
| PATENT NO. | : 7,902,660 B1 | Page 1 of 1 |
| APPLICATION NO. | : 11/440548 | |
| DATED | : March 8, 2011 | |
| INVENTOR(S) | : Kyu Won Lee, Doo Hyun Park and Dong Hee Kang | |

It is certified that error appears in the above-identified patent and that said Letters Patent is hereby corrected as shown below:

In Column 15, Line 43, Claim 5, replace "each layers" with --each layer--.

Signed and Sealed this
Twentieth Day of September, 2011

David J. Kappos
*Director of the United States Patent and Trademark Office*